(12) United States Patent
Jacobson et al.

(10) Patent No.: US 7,919,402 B2
(45) Date of Patent: Apr. 5, 2011

(54) CLUSTER ION IMPLANTATION FOR DEFECT ENGINEERING

(75) Inventors: Dale C. Jacobson, Salem, NH (US);
Thomas N. Horsky, Boxborough, MA (US); Wade A. Krull, Marblehead, MA (US); Karuppanan Sekar, Billerica, MA (US)

(73) Assignee: SemEquip, Inc., North Billerica, MA (US)

( * ) Notice: Subject to any disclaimer, the term of this patent is extended or adjusted under 35 U.S.C. 154(b) by 0 days.

(21) Appl. No.: 12/100,840

(22) Filed: Apr. 10, 2008

(65) Prior Publication Data

US 2008/0299749 A1 Dec. 4, 2008

Related U.S. Application Data

(63) Continuation-in-part of application No. 11/634,565, filed on Dec. 6, 2006, now Pat. No. 7,666,771.

(51) Int. Cl.
*H01L 21/265* (2006.01)

(52) U.S. Cl. ............... 438/515; 438/528; 257/E21.339

(58) Field of Classification Search .............. 438/515, 438/528
See application file for complete search history.

(56) References Cited

U.S. PATENT DOCUMENTS

| | | | |
|---|---|---|---|
| 5,107,538 | A | 4/1992 | Benton et al. |
| 5,354,381 | A | 10/1994 | Sheng |
| 5,497,006 | A | 3/1996 | Sferlazzo et al. |
| 5,558,718 | A | 9/1996 | Leung |
| 6,043,139 | A | 3/2000 | Eaglesham et al. |
| 6,153,920 | A | 11/2000 | Gossmann et al. |
| 6,207,005 | B1 | 3/2001 | Henley et al. |
| 6,452,338 | B1 | 9/2002 | Horsky |
| 6,686,595 | B2 | 2/2004 | Horsky |
| 6,893,907 | B2 | 5/2005 | Maydan et al. |

(Continued)

FOREIGN PATENT DOCUMENTS

DE 4440072 2/1996

(Continued)

OTHER PUBLICATIONS

K. Sekar et al., "Optimization of Annealing for Clusterboron and Clustercarbon PMOS SDE", 14th International Conference on Advanced Thermal Processing of Semiconductors—RTP2006, IEEE, Oct. 2006, pp. 251-254.*

(Continued)

*Primary Examiner* — Stephen W Smoot
(74) *Attorney, Agent, or Firm* — John S. Paniaguas; Katten Muchine Rosenman LLP

(57) ABSTRACT

A method of semiconductor manufacturing is disclosed in which doping is accomplished by the implantation of ion beams formed from ionized molecules, and more particularly to a method in which molecular and cluster dopant ions are implanted into a substrate with and without a co-implant of non-dopant cluster ion, such as a carbon cluster ion, wherein the dopant ion is implanted into the amorphous layer created by the co-implant in order to reduce defects in the crystalline structure, thus reducing the leakage current and improving performance of the semiconductor junctions. These compounds include co-implants of carbon clusters with implants of monomer or cluster dopants or simply implanting cluster dopants. In particular, the invention described herein consists of a method of implanting semiconductor wafers implanting semiconductor wafers with carbon clusters followed by implants of boron, phosphorus, or arsenic, or followed with implants of dopant clusters of boron, phosphorus, or arsenic.

17 Claims, 24 Drawing Sheets

U.S. PATENT DOCUMENTS

| 7,015,108 | B2* | 3/2006 | Vanderpool et al. ......... 438/305 |
| 7,666,771 | B2 | 2/2010 | Krull et al. |
| 2002/0139975 | A1 | 10/2002 | Lewis et al. |
| 2003/0023118 | A1 | 1/2003 | Kanayama et al. |
| 2004/0002202 | A1 | 1/2004 | Horsky et al. |
| 2004/0164341 | A1* | 8/2004 | Forbes et al. ................ 257/315 |
| 2004/0166612 | A1 | 8/2004 | Maydan et al. |
| 2004/0235280 | A1 | 11/2004 | Keys et al. |
| 2005/0181621 | A1 | 8/2005 | Borland et al. |
| 2006/0097193 | A1 | 5/2006 | Horsky et al. |
| 2007/0148888 | A1 | 6/2007 | Krull |
| 2007/0178678 | A1* | 8/2007 | Hatem et al. ................. 438/513 |
| 2007/0194252 | A1 | 8/2007 | Horsky et al. |
| 2008/0299749 | A1 | 12/2008 | Jacobson et al. |

FOREIGN PATENT DOCUMENTS

| EP | 0 219 243 | 4/1987 |
| EP | 06844937 | 10/2009 |
| WO | WO 99/65070 | 12/1999 |
| WO | WO 01/43175 | 6/2001 |
| WO | WO 2004/003973 A2 | 1/2004 |
| WO | WO 2007/146942 | 12/2007 |
| WO | WO 2008/128039 A3 | 10/2008 |

OTHER PUBLICATIONS

U.S. Appl. No. 10/519,699, filed Sep. 14, 2005, Horsky et al.
U.S. Appl. No. 11/934,873, filed Nov. 5, 2007, Horsky et al.
Robertson et al., "The effect of impurities on diffusion and activation of ion implanted boron in silicon", *Mat. Res. Soc. Symp.*, vol. 610, 2000, pp. B5.8.1-5.8.6.
Collart et al., "Co-Implantation with Conventional Spike Anneal Solutions for 45nm Ultra-Shallow Junction Formation", *Proc. of 8th Intl. Workshop on Fabrication, Characterization and Modelling of Ultra-Shallow Doping Profiles in Semiconductors*, Jun. 2005, pp. 327-328.
Ueda et al., "High dose nitrogen and carbon shallow implantation in Si by plasma immersion ion implantation", *Nuclear Instruments and Methods in Physics Research*, 2001, pp. 715-720.
Lindner, "ion beam synthesis of buried SiC layers in silicon: Basic physical processes", *Nuclear instruments and Methods in Physics Research*, 2001, pp. 44-54.
Lindner et al., "Mechanisms of SiC Formation in the Ion Beam Synthesis of 3C-SiC Layers in Silicon", *Materials Science Forum*, vols. 264-268 (1998), pp. 215-218.
Ang et al., "Thin body siliconon-insulator N-MOSFET with silicon carbon source/drain regions for performance enhancement", *IEDM Workshop*, Washington, D.C., Dec. 2005, pp. 20.3.1-20.3.4.
Deguchi et al., "B-SiC formation by low-energy ion doping technique", *Japanese Jour. Of Appl. Physics*, vol. 29, No. 8, Aug. 1990, pp. 1493-1496.
Vanderpool et al., "Control of Phosphorus Transient Diffusing using Co-implantation" *Ion Implantation Technology*, Jun. 2006, pp. 41-45.
Liebert et al., "Plasma Doping System for 200 and 300 mm Wafers" *Proceedings, 13th Int. Conf. Ion Implant. Tech.*, IEEE, 2000, pp. 472-475.
Renau et al. "Comparison of Plasma Doping and Beamline Technologies for Low Energy Ion Implantation," *IEEE Proceedings of the 2002 14th Int. conf. on Ion Implantation Technology*, Taos, NM, USA, Sep. 22-27, 2002, pp. 151-156.
Stegemann et al., Subsequent Layer Growth of Supported Nanopartilces by Deposition of $Sb_4$ Clusters onto $MoS_2$ (0001), New *Journal of Physics* 4 (2002) 89.
Polak et al., "Photoelectron Spectroscopy of Small Antimony Cluster Anions" *J. Chem. Phys 97 (12)*, Dec. 15, 1992.
Horsky et al. "Boron Beam Performance and In-Situ Cleaning of the ClusterIon Source", CP866, Ion Implantation Technology, 2006 American Institute of Physics.
Honing et al. "Vapor Pressure Data for the Solid and Liquid Elements", RCA Laboratories, RCA Review, Jun. 1969, p. 284-305.
Borland et al. "45nm Node p+ USJ Formation with High Dopant Activation and Low Damage", IEEE 2006, p. 4-9.
Borland et al. "High Dopant Activation and Low Damage P+ USJ Formation" CP866, Ion Implantation Technology, 2006 American Institute of Physics, p. 96-100.
Kawasaki et al. "Ultra-Shallow Junction Formation by $B_{18}H_{22}$ Ion Implantation" Nuclear Instruments and Methods in Physics Research B 237 (2005) p. 25-29.
Thompson et al. "Silicon Melt, Regrowth and Amorphization Velocities During Pulsed Laser Irradiation" 1983 The American Physical Society, Physical Review Letters, vol. 50, No. 12, Mar. 21, 1983, p. 896-899.
Motooka et al. "Amorphization Processes in Ion Implanted Si: Temperature Dependence" Japanese Journal of Applied Physics, vol. 30, No. 12B, Dec. 1991, p. 3617-3620.
Thomas N. Horsky "Universal Ion Source for Cluster and Monomer Implantation" Ion Implantation Technology, 2006 American Institute of Physics, p. 159.
Kirkby et al. "Ion Implantation Technology" 16th International Conference on Ion Implantation Technology IIT 2006, Marseille, France, Jun. 11-16, 2006.
Motooka et al. "Amorphization Processes in Ion Implanted Si: Ion Species Effect" 1992 American Institute of Physics, Appl. Physics Lett. 61 (25), Dec. 12, 1992.
Motooka et al., "Amorphization Processes in Self-Ion-Implanted Si: Dose Dependence" 1991 American Institute of Physics, Appl. Phys. Lett. 58 (21), May 27, 1991, p. 2360-2362.
Tieger et al. "ClusterBoron Implants ion a High Current Implanter" 2006 American Institute of Physics, Ion Implantation Technology, p. 206-209.
Landi et al. "Electrical Activation of Boron-Implanted Silicon During Rapid Thermal Annealing" Appl. Phys. A. 47, 359-366 (1988).
Jones et al. Using doping Superlattices to Study Transient-Enhanced Diffusion of Boron in Regrown Silicon. 1996 American Institute of Physics, Appl. Phys. Lett. 68 (22) May 27, 1996.
Solmi et al. "High-Concentration Boron Diffusion in Silicon: Simulation of the Precipitation Phenomena" 1990 American Institute of Physics, J. Appl. Phys. 68 (7), Oct. 1, 1990.
Holland et al. "Characteristics of Rapid Thermal Annealing in Ion-Implanted Silicon" 1986 American Institute of Physics, J. Appl. Phys. 59 (3), Feb. 1, 1986.
Schmitz et al. "Ultra-Shallow Junction Formation by Outdiffusion from Implanted Oxide" IEEE 1998, p. 37.3.1-37.3.4.
Nishikawa et al., "Reduction of Transient Boron Diffusion in Preamorphized Si by Carbon Implantation," Semiconductor Technology Laboratory, Oki Electric Industry Co., Ltd, Tokyo 193 Japan, Appl. Phys. Lett., vol. 60, No. 18, pp. 2270-2272 (1992).
McLafferty, "Interpretation of Mass Spectra," third Edition Cornell University, University Science Books, 1980, ISBN 0-935702-04-0.
Volz, et al., "Silicon Carbide and Amorphous Carbon Film Formation by Plasma Immersion Ion Implantation: A Comparison of Methane and Toluene as Plasma Forming Gases" Surface and Coatings Technology 136 (2001), pp. 197-201.
Cowern et al., Computational Modeling of Co-implanted Carbon for 65nm Node USJ Formation, Advanced Technology Institute, University of Surrey, Guildford, Surrey GU2 7XH, UK, 2004, p. 300.
Rizk et al., "Modeling the Suppression of Borun Diffusion in Si/SiGe Due to Carbon Incorporation," Department of Electrical and Computer Engineering, McMaster University, Hamilton, ON L8S 4K1, Canada, pp. 315-322, May 2006.
Law et al., "Influence of Carbon on the Diffusion of Interstitials and Boron in Silicon," Department of Electrical and Computer Engineering, University of Florida, Gainesville, FL., vol. 610, 2000 Materials Research Society, pp. B7.4.1-B7.4.5.
Stolk, et al., "Understanding and Controlling Transient Enhanced Dopant Diffusion in Silicon," vol. 354, 1995 Materials Research Society, pp. 307-319.

* cited by examiner $B_{18}H_{22}$ X-TEM with various anneals
(JOB & NEC, IWJT2006 & SST2006)

(a) $B_{18}H_{22}$ 6.2nm self-amorphous layer (as-implanted)
(b) SPE with no EOR damage
(c) Laser with no EOR damage
(d) Flash with no EOR damage EOR at 12 nm

CLUSTER ION IMPLANTATION FOR DEFECT ENGINEERING

CROSS REFERENCE TO RELATED APPLICATIONS

This application is a continuation-in-part of commonly owned U.S. patent application Ser. No. 11/634,565, filed Dec. 6, 2006, entitled "System and Method for the Manufacture of Semiconductor Devices by the Implantation of Carbon Clusters" by Wade A. Krull and Thomas N. Horsky, now U.S. Pat. No. 7,666,771, hereby incorporated by reference.

BACKGROUND OF THE INVENTION

1. Field of the Invention

The present invention relates to a method of semiconductor manufacturing in which doping is accomplished by the implantation of ion beams formed from ionized molecules, and more particularly to a method in which molecular and cluster dopant ions are implanted into a substrate with and without a co-implant of non-dopant cluster ion, such as a carbon cluster ion, wherein the dopant ion is implanted into the amorphous layer created by the co-implant in order to reduce defects in the crystalline structure, thus reducing the leakage current and improving performance of the semiconductor junctions, the dopant ions being of the form $A_nH_x^+$, or $A_nR_zH_x^+$, where n, x and z are integers with n greater than or equal to 4 and x and z greater than or equal to 0, and A is carbon, boron, indium, arsenic, phosphorus, or antimony and R is a non-dopant molecule, radical or ligand comprised of atoms such as Si, Ge, F, H or C which are not injurious to the implantation and doping process, or to device performance. The present invention utilizes the auto-amorphization properties of clusters in order to ameliorate the problem of annealing out the implant damage caused by prior art Ge pre-amorphization implants. These species, either alone or in combination, allow for the formation of defect-free USJ's of both n- and p-type.

2. Description of the Prior Art

The Ion Implantation Process

The fabrication of semiconductor devices involves, in part, the introduction of specified impurities into the semiconductor substrate to form doped regions. The impurity elements are selected to bond appropriately with the semiconductor material so as to create electrical carriers. This introduction alters the electrical conductivity of the semiconductor material in the "doped" region. The concentration of dopant impurities so introduced determines the electrical conductivity of the resultant region. The electrical carriers can either be electrons (generated by N-type dopants) or holes (generated by P-type dopants). Many such N- and P-type impurity regions must be created to form transistor structures, isolation structures and other such electronic structures, which function collectively as a semiconductor device.

Ion implantation is the conventional method of introducing dopants into a semiconductor substrate. In ion implantation, a feed material containing the desired element is introduced into an ion source and energy is supplied to ionize the feed material, creating ions which contain the dopant element. For example, in silicon, the elements As, P, and Sb are donors or N-type dopants, while B and In are acceptors or P-type dopants.

An accelerating electric field is provided to extract and accelerate the ions, thus creating an ion beam. Typically, the ions contain a positive charge. However, in certain cases, negatively-charged ions may be used. Mass analysis is used to select the exact species to be implanted. The mass-analyzed ion beam may subsequently pass through ion optics which alter its final velocity or change its spatial distribution prior to being directed into a semiconductor substrate or work piece. The accelerated ions possess a well-defined kinetic energy which allows the ions to penetrate the target to a predetermined depth. Both the energy and mass of the ions determine their depth of penetration into the target. Higher energy and/or lower mass ions allow deeper penetration into the target due to their greater velocity.

The ion implantation system is constructed to carefully control the critical variables in the implantation process. Critical variables include: the ion acceleration, ion mass, ion beam current (electrical charge per unit time), and ion dose at the target (total number of ions per unit area that penetrate into the target). Beam angular divergence (the variation in the angles at which the ions strike the substrate) and beam spatial uniformity and extent must also be controlled in order to preserve semiconductor device yields.

Ion implantation is always followed by thermal heating or annealing step. The purpose of this step is two-fold. One, to activate the dopant that has been implanted into the semiconductor. Activation is the process of replacing a Si atom by a dopant atom in the crystal. This step is required to change the conductivity of the material. Two, correct damage to the crystal caused by the ion implantation process.

Damage to the crystal is caused by two energy loss mechanisms that reduce the energy (velocity) of the ions. Firstly there is electron energy loss where energy form the ion is transferred to the electrons in the material. This can cause point defects in the crystal. These defects are easily healed by thermal treatment of a few hundred degrees C. Secondly there is nuclear energy loss that occurs when the ion has a collision with a lattice atom. This results in momentum transfer to the lattice atom and can actually knock it out of place and give it a velocity which interns strikes another atom causing it to move. This cascade of displaced atoms can lead to extended defects. These defects are much more difficult to heal and require higher temperature treatments.

The probability of electronic energy transfer is much higher at high energy that at low energy and conversely the probability of a nuclear collision event is lower at high energy and higher at low energy. Therefore near the surface where the energy of the ion beam is higher, most of the defects are point defects, but deeper into the material where the energy has been reduced the defects are primarily due to nuclear collisions and are more difficult to anneal out. The defects at the end of the ion path are call end-of-range defects and are particularly difficult to anneal. Temperatures almost to the melting point are required to remove these defects. Such high temperature anneals are known to be detrimental to device structures because they cause long diffusion lengths which result in deeper dopant profiles than desired.

This dilemma of how to eliminate damage that diminishes device performance while at the same time not causing the dopants to diffuse deep into the silicon substrate has long been studied. Many annealing schemes have been developed since the invention of solid state devices. These schemes include low temperature long time anneals to very high temperature very short duration anneals such as sub-melting laser annealing, or liquid phase annealing, such as with flash lamps and lasers where the very near surface is melted. There have even been attempts to use microwaves and shock waves to anneal silicon that has been implanted. The goal is always high activation, shallow distributions of the dopant, and removal of residual crystalline damage.

The post anneal residual damage must be engineered to assure proper device performance. There is a strong interaction between the implant conditions, anneal conditions and ambient conditions during the anneal. During the implant, the species, the energy, the dose, the dose rate, the temperature, the orientation of the wafer with respect to the ion beam, and the angular uniformity of the ion beam all have an impact on the damage profile in the silicon crystal. The anneal temperature, ramp rate, the times and temperatures of thermal plateaus, the ramp rates between plateaus, the ramp rate between a plateau and the maximum temperature, the maximum temperature, the time at maximum temperature, and the quench rate all have effects on the damage structures and profiles. The chemical ambient during the anneal, as well as wavelength of the annealing energy, all affects the final state of the damage. This study and control of these variables, and their interaction with one another, is known as defect engineering. Its goal is to process the material in such as way as to use the damage for a positive result, as in gettering, or to minimize the residual damage as in the junction of a transistor where residual damage can lead to extraneous electrical paths causing leakage or crosstalk between adjacent transistors.

A key process of semiconductor manufacturing is the creation of P—N junctions within the semiconductor substrate. This requires the formation of adjacent regions of P-type and N-type doping. An important example of the formation of such a junction is the implantation of P or N-type dopants into a semiconductor region already containing a uniform distribution of one dopant type. In these cases, an important parameter is the junction depth. The junction depth is defined as: the depth from the semiconductor surface at which the P-type and N-type dopants have equal concentrations. This junction depth is a function of the implanted dopant mass, energy and dose.

An important aspect of modern semiconductor technology is the continuous evolution to smaller and faster devices. This process is called scaling. Scaling is driven by continuous advances in lithographic process methods, allowing the definition of smaller and smaller features in the semiconductor substrate which contains the integrated circuits. A generally accepted scaling theory has been developed to guide chip manufacturers in simultaneously resizing all design aspects of the semiconductor device: i.e., at each technology or scaling node. The greatest scaling impact on ion implantation processes is the scaling of junction depths. This requires decreasing the junction depth as the device dimensions are decreased, requiring shallower junctions as integrated circuit technology scales. This translates into the following requirement: ion implantation energies must be reduced with each scaling step. The extremely shallow junctions called for by modern, sub-100 nanometer (nm) devices are termed "Ultra-Shallow Junctions", or USJ Physical Limitations on Low-Energy Beam Transport Due to the aggressive scaling of junction depths in CMOS processing, the ion energy required for many critical implants has decreased to the point that conventional ion implantation systems cannot maintain the desired wafer throughput. The limitations of conventional ion implantation systems at low beam energy are most evident in the extraction of ions from the ion source, and their subsequent transport through the implanter's beam line. Ion extraction is governed by the Child-Langmuir relation, which states that the extracted beam current density is proportional to the extraction voltage (i.e., beam energy at extraction) raised to the 3/2 power. Similar constraints affect the transport of the low-energy beam after extraction. A lower energy ion beam travels with a smaller velocity, hence for a given value of beam current the ions are closer together, i.e., the ion density increases. This can be seen from the relation $J=\eta ev$, where J is the ion beam current density in $mA/cm^2$, $\eta$ is the ion density in $ions/cm^{-3}$, e is the electronic charge ($=6.02\times10^{-19}$ Coulombs), and v is the average ion velocity in cm/s. In addition, since the electrostatic forces between ions are inversely proportional to the square of the distance between them, electrostatic repulsion is much stronger at low energy, resulting in increased dispersion of the ion beam. This phenomenon is called "beam blow-up" and is the principal cause of beam loss in low-energy transport. Low-energy electrons present in the implanter beam line tend to be trapped by the positively-charged ion beam, compensating for space-charge blow-up during transport. Blow-up nevertheless still occurs, and is most pronounced in the presence of electrostatic focusing lenses, which tend to strip the loosely-bound, highly mobile compensating electrons from the beam. In particular, severe extraction and transport difficulties exist for light ions, such as the N-type dopants phosphorus and arsenic. Being lighter than arsenic, phosphorus atoms penetrate further into the substrate than many other atoms, including arsenic. Hence the required implantation energies for phosphorus are lower than for arsenic. In fact, extremely low implantation energies, as low as 1 keV, are being required for certain leading edge USJ processes.

Heavier species, specifically cluster molecules, not only provide increased beam currents, but in many cases tend to auto-amorphize the crystalline silicon lattice. This type of auto-amorphization has been shown to be beneficial to the activation of P-type dopants, such as boron, and should provide similar benefits for N-type dopants. Also, auto-amorphization reduces ion channeling, enabling a shallower junction than possible in crystalline silicon. In fact, the process of record for many USJ logic manufacturers consists of a pre-amorphization implant of Ge or Si prior to performing the conductive doping implants in order to obviate channeling effects. The use of Ge or Si pre-amorphization implants has been shown to create end-of-range defects which result in increased leakage currents in the fabricated devices. Large cluster or molecular implantation has recently shown promise in the reduction or elimination of the end-of-range damage form doping implants. The kinds of defects and their locations in the crystal can be controlled by modifying the cluster or molecule size and composition used in doping the crystal. Carbon containing molecular ions may also be used to pre-amorphize semiconductor substrates in a similar way that Si, Ge and doping clusters do, for example, as disclosed in commonly owned U.S. patent application Ser. No. 11/634,565, filed on Dec. 6, 2006, entitled "System and Method for the Manufacture of Semiconductor Devices by the Implantation of Carbon Clusters" by Wade A. Krull and Thomas N. Horsky. Additionally, the carbon is known to inhibit the diffusion of boron during the annealing process.

Molecular Ion Implantation

A technique to overcome the limitations imposed by the Child-Langmuir relation discussed above is to increase the transport energy is by ionizing a molecule containing the dopant of interest, rather than a single dopant atom. Upon entering the substrate, the molecule breaks up into its constituent atoms, sharing the energy of the molecule among the individual atoms according to their distribution in mass, while the kinetic energy of the molecule is higher during transport, the dopant atom's implantation energy is much lower than the original transport kinetic energy of the molecular ion. Consider the dopant atom "X" bound to a radical "Y" (disregarding for purposes of discussion the issue of whether "Y" affects the device-forming process). If the ion $XY^+$ were implanted in lieu of $X^+$, then $XY^+$ must be extracted and transported at a higher energy. The increase is by a factor equal to the mass of XY divided by the mass of X. This ensures that the velocity of X in either case is the same. Since the space-charge effects described by the Child-Langmuir relation discussed above are super-linear with respect to ion energy, the maximum transportable ion current is increased. Historically, the use of polyatomic molecules to ameliorate the problems of low energy implantation is well known in the art. A common example has been the use of the $BF_2^+$ molecular ion for the implantation of low-energy boron, in lieu of $B^+$. This process dissociates $BF_3$ feed gas to the $BF_2^+$ ion for implantation. In this way, the ion mass is increased to 49 AMU from 11 AMU. This increases the extraction and transport energy by more than a factor of 4 (i.e., 49/11) over using single boron atoms. Upon implantation, however, the boron energy is reduced by the same factor of (49/11). It is worthy of note that this approach does not reduce the current density in the beam, since there is only one boron atom per unit charge in the beam. A detriment to this process is the implanting of fluorine atoms into the semiconductor substrate along with the boron. This is an undesirable feature of this technique since fluorine has been known to exhibit adverse effects on the semiconductor device.

Cluster Implantation

A more effective way to increase the dose rate is to implant clusters of dopant atoms. That is, molecular ions of the form $X_n Y_m^+$, where n and m are integers and n is greater than one. Recently, there has been seminal work using boron cluster as a feed material for ion implantation. The implanted particle was a positive ion of the boron cluster molecule, $B_{18}H_{22}$, which contains 18 boron atoms, and is therefore a "cluster" of boron atoms. This technique not only increases the mass of the ion and hence the transportation energy, but for a given ion current, it substantially increases the implanted dose rate, since the boron cluster ion $B_{18}H_x^+$ has eighteen boron atoms. By significantly reducing the electrical current carried in the ion beam (by a factor of 18 in the case of boron cluster ions verses single boron atoms) not only are beam space-charge effects reduced, increasing beam transmission, but wafer charging effects are reduced as well. Since positive ion bombardment is known to reduce device yields by charging the wafer, particularly damaging sensitive gate isolation, such a reduction in electrical current through the use of cluster ion beams is very attractive for USJ device manufacturing. USJ manufacturing must accommodate increasingly thinner gate oxides and exceedingly low gate threshold voltages. Thus, there is a critical need to solve two distinct problems facing the semiconductor manufacturing industry today: wafer charging, and low productivity in low-energy ion implantation.

The principal means of forming shallower junctions in each of the last few generations has been through the reduction of annealing times (soak, spike, millisecond anneals) and overall thermal budget. While this approach produces shallower junctions with good activation, it makes the recovering of implant damage more difficult. In particular, the end-of-range (EOR) defects created by the widely used Ge pre-amorphization (PAI) implant typically survive low thermal budget treatments, resulting in higher junction leakage. Since the creation of end-of-range defects has proven to be a significant barrier to the fabrication of very low-leakage USJ devices, the fabrication of transistors with improved leakage characteristics is thus necessary to enable future generations of mobile devices. As illustrated below, ion implantation with clusters of boron and carbon allows for the elimination of all defects, and can achieve target USJ's for 45 nm, 32 nm, and smaller technology nodes.

Cluster ion implantation, or molecular implantation, has recently emerged as a production alternative for USJ formation. The use of cluster species dramatically increased wafer throughputs for the ultra-low energy implants required for USJ formation [1]. Cluster technology is now available for implants of B ($B_{18}H_x^+$), C ($C_{16}H_x^+$ or $C_7H_x^+$), As ($As_4^+$) and P ($P_4^+$). In addition, it is now becoming evident that the auto-amorphization feature of these implants allows for the elimination of the Ge PAI step, for example, as discussed in John Borland, Masayasu Tanjo, Dale Jacobson, and Takayuki Aoyama, Proceedings of the Eighth International Workshop on: Fabrication, Characterization, and Modeling of Ultra-Shallow Doping Profiles in Semiconductors, Jun. 5-8, 2005, Daytona Beach, Fla., USA, pp. 201-208, hereby incorporated by reference.

It has recently been reported in the literature John Borland et al., IEEE Extended Abstracts of the Sixth International Workshop on Junction Technology, May 15-16, 2006, Shanghai, China, pp. 4-9 and John Borland et al., IEEE Proceedings of the $XVI^{th}$ International Conference on Ion Implantation Technology, Jun. 11-16, 2006, Marseilles, France, hereby incorporated by reference, that $B_{18}H_x^+$-implanted junctions produce much lower photoluminescence (PL) and junction leakage signals than any of B, $BF_2$, or Ge pre-amorphized samples when low-thermal budget SPE and laser anneals are used. By careful TEM analysis of implanted samples followed by anneal cycles of spike, SPE, laser, and flash techniques, it has been determined that implanting wafers with boron or carbon clusters of sufficient dose to amorphize the silicon results in clean annealed junctions with no observable EOR defects. While the theoretical basis for this effect is still emerging, it is clear that the implantation of a cluster of light atoms is fundamentally different from the implantation of a monomer ion.

In the case of the implantation of ions formed from $B_{18}H_{22}$, it has been established that simple substitution of this specie, with the appropriate accounting of the implanted dose (multiplying the measured dose by 18) and adjustment of the implantation energy (dividing the extracted ion energy by 20 for boron, and by 4.3 for $BF_2$) for the boron or $BF_2$ implant can not only match the implanted profiles, but largely eliminates channeling due to the auto-amorphization properties of implanting this cluster, for example, as disclosed by Y. Kawasaki, T. Kuroi, K Horita, Y. Ohno and M. Yoneda, Tom Horsky, Dale Jacobson, and Wade Krull, Nucl. Inst. Meth. Phys. Res. B 237 (2005), pp. 25-29, hereby incorporated by reference. A surprising side-benefit of this substitution is the observed absence of defects in the annealed junctions produced by this method.

One measure of performance of a semiconductor is the amount of leakage current across the junctions. Leakage current results from defects in the crystalline structure of the substrate caused by the implantation of the dopant. Although there have been efforts to reduce the defects and thus reduce leakage current in semiconductor junctions, leakage currents in available semiconductors are still at unacceptable levels. Thus, there is a need to enhance the performance of semiconductor junctions by further reducing leakage currents.

SUMMARY OF THE INVENTION

Briefly, the present invention to a method of semiconductor manufacturing in which doping is accomplished by the implantation of ion beams formed from ionized molecules, and more particularly to a method in which molecular and cluster dopant ions are implanted into a substrate with and without a co-implant of non-dopant cluster ion, such as a carbon cluster ion, wherein the dopant ion is implanted into the amorphous layer created by the co-implant in order to reduce defects in the crystalline structure, thus reducing the leakage current and improving performance of the semiconductor junctions. Dopant ion compounds of the form $A_nH_x^+$ and $A_nR_zH_x^+$ are used in order to minimize crystal defects as a result of ion implantation. These compounds include co-implants of carbon clusters with implants of monomer or cluster dopants or simply implanting cluster dopants. In particular, the invention described herein consists of a method of implanting semiconductor wafers implanting semiconductor wafers with carbon clusters followed by implants of boron, phosphorus, or arsenic, or followed with implants of dopant clusters of boron, phosphorus, or arsenic. The molecular cluster ions have the chemical form $A_nH_x^+$ or $A_nR_zH_x^+$, where A designates the dopant or the carbon atoms, n and x are integers with n greater than or equal to 4, and x greater than or equal to 0, and R is a molecule which contains atoms which, when implanted, are not injurious to the implantation process (for example, Si, Ge, F, H or C). These ions are produced from chemical compounds of the form $A_bL_zH_m$, where the chemical formula of $L_z$ contains R, and b may be a different integer from n and m may be an integer different from x and z is an integer greater than or equal to zero.

Some of these implant dopants which contain As or P atoms have been disclosed in commonly owned U.S. Provisional Patent Application No. 60/856,994, filed 6 Nov. 2006 entitled "An Ion Implantation Device and a Method of Semiconductor Manufacturing by the Implantation of Molecular Ions Containing Phosphorus and Arsenic" by Manning et. al., hereby incorporated by reference are: Heptaphosphane, $P_7H_3$; Cyclopentaphosphane, $P_5H_5$; $P_7H_3$; $As_5H_5$; $As_7H_3$; Tetra-tertbutylhexaphosphane; Pentamethylheptaphosphane; Polyphosphides: $Ba_3P_{14}$, $Sr_3P_{14}$, Monophosphides: $Li_3P_7$, $Na_3P_7$, $K_3P_7$, $Rb_3P_7$, $Cs_3P_7$; to $Me_3SiPH_2$; $(Me_3SiP)_4$; compounds $P_{11}(SiMe_3)_3$ and $As_7(SiMe_3)_3$.; $P_{11}(SiMe_3)_3$ and $As_3(SiMe_3)_3$; $As_7(SiH_3)_3$ and $As_5(SiH_3)_5$; and $P_7(SiMe_3)_3$. In addition, boron-bearing cluster materials useful for PMOS implantation are $B_{10}H_{14}$, $B_{18}H_{22}$, $B_2H_6$, $B_5H_9$, $B_{20}H_x$, and carboranes, such as $C_2B_{10}H_{12}$, for example.

The invention also relates to a method of manufacturing a semiconductor device being capable of forming ultra-shallow impurity-doped regions of N and P-type conductivity in a pre-amorphized zone, formed by carbon clusters of the form $C_nH_x^+$ or $C_nR_zH_x^+$ where C is carbon, and H is hydrogen, n and x are integers with $n \geq 1$, and $x \geq 0$, R is a molecule, radical or ligand which contain atoms that are not injurious to the implantation process or semiconductor device performance, followed by a dopant implant, such as P, As, or B, thus limiting channeling, dopant diffusion and eliminating end of range defects when coupled with an appropriate anneal, and furthermore to do so with high productivity. The energy of the pre-amorphizing implant must be chosen based on the specific molecule to form an amorphous layer of a thickness equal to the projected range of the dopant implant to five times the range of the dopant implant. The dose of the pre-amorphizing implant must be chosen based on the specific nature and composition of the molecule or cluster to fully amorphize the aforementioned surface layer. To effectively control diffusion the peak concentration of carbon must be in the range of 1E17 to 1E19 carbon/cm³. Furthermore the pre-amorphizing implant must always be accomplished before the doping implant is commenced.

Recent developments in semiconductor chip development has lead to an understanding that better activation of the source—drain extension could be demonstrated by implantation of Sb4 ions. As mentioned above, U.S. application No. 60/856,994, now U.S. application Ser. No. 11/934,873, Arsenic and Phosphorous molecular ions may be used in ion implantation and in particular in applicant's ion implantation source. Antimony belongs to the same column, Group V, of the periodic chart and therefore has the same outer shell electron structure as arsenic and phosphorus. It is well known that As and P both sublime to form As4 and P4 respectively. It would be therefore expected that Sb would sublimate into Sb4 molecules. Furthermore, as reported by B. Stegemann, B. Kaiser, & K. Rademann, New Journal of Physics, 4 (2002) 89, Sb4 is a stable molecular cluster which can easily be obtained by evaporating solid antimony. In addition, it is the primary component of Sb vapor with small amounts of the dimer (Sb2) and trimer (Sb3) included, see Mark L. Polak et. al., J. Chem. Phys. 97 (12), 15 Dec. 1992. Finally, the vapor pressure of Sb is about 1×10(−5) torr at 500 C, see R. E. Honig and D. A. Kramer, RCA Review, 30, (1969) 285, which makes it a reasonable candidate to vaporize from a solid in a typical ion source hot oven. Thus, ion implantation of the dopant, molecular antimony, and in particular, the tetramer, Sb4, may be used in the manufacture of semiconductors.

In a preferred embodiment, the carbon cluster implant is chosen such that the amorphous layer it creates is at least as thick as the end of range of the subsequent dopant implant, so that virtually all of the defects associated with the dopant implant are created in amorphous material. This insures that these defects will be easily annealed out during the subsequent activation step.

An alternate embodiment of the invention is to provide a method of manufacturing a semiconductor device, this method being capable of forming ultra-shallow impurity-doped regions of N and P-type conductivity in an pre-amorphized zone, formed by carbon clusters of the form $C_nH_x^+$, or $C_nR_zH_x^+$, where C is carbon, and H is hydrogen, n, x and z are integers with $n \geq 1$, and x and $z \geq 0$, R is a molecule, radical or ligand which contain atoms that are not injurious to the implantation process or semiconductor device performance, using ionized clusters of the form $A_nH_x^+$, $A_nR_zH_x^+$, $A_nC_mH_x^+$, or $A_nC_mR_zH_x^+$ where A is a dopant atom such as B, P, or As, n, x and z are integers with $4 \leq n$, $0 \leq m$, and x and $z \geq 0$, C is a carbon atom, R is a molecule, radical or ligand which contain atoms that are not injurious to the implantation process or semiconductor device performance, thus eliminating end-of-range defects when coupled with an appropriate anneal, and furthermore to do so with high productivity. The energy of the pre-amorphizing implant must be chosen based on the specific molecule to form an amorphous layer of a thickness equal to the projected range of the dopant implant to five times the rage of the dopant implant. The dose of the pre-amorphizing implant must be chosen based on the specific nature and composition of the molecule or cluster to fully amorphize the aforementioned surface layer. To effectively control diffusion the peak concentration of carbon must be in the range of 1E17 to 1E19 carbon/cm³. Furthermore the pre-amorphizing implant must always be accomplished before the doping implant is commenced. The pre-amorphizing implant must always be accomplished before the doping implant is commenced.

Another alternate embodiment of the invention is to provide a method of manufacturing a semiconductor device, this method being capable of forming ultra-shallow impurity-doped regions of N and P-type conductivity in an auto-amorphized zone, using ionized clusters of the form $A_nC_mH_x^+$, or $A_nC_mR_zH_x^+$, where A is a dopant atom such as B, P, or As, n, x and z are integers with $1 \leq n$, $0 \leq m$, and x and $z \geq 0$, R is a molecule, radical or ligand which contain atoms that are not injurious to the implantation process or semiconductor device performance, thus limiting the dopant diffusion and eliminating end-of-range defects with a single implant, and furthermore to do so with high productivity. In this preferred embodiment, the carbon cluster implant is chosen such that the amorphous layer it creates is at least as thick as the end of range of the subsequent dopant implant, so that virtually all of the defects associated with the dopant implant are created in amorphous material. This insures that these defects will be easily annealed out during the subsequent activation step. To effectively control diffusion the peak concentration of carbon must be in the range of 1E17 to 1E19 carbon/cm$^3$.

The present invention increases the benefits of N-type cluster implantation, for example, by using significantly larger dopant clusters, such as, phosphorus or arsenic clusters having more than 3 dopant atoms. Carbon cluster ions, $C_xH_y^+$, can be used to deliver low energy high dose carbon ion beam to the semiconductor surface to pre-amorphize the silicon to eliminate channeling and at the same time position C atoms below the surface to substantially reduce B diffusion in the B implant that will immediately follow the C implant. Additionally the carbon cluster exhibits the same charge reducing benefits as the doping clusters.

There are several mechanisms for the formation of end of range defect-free implants in accordance with the present invention. These mechanisms include:

The cluster implants are at such a low equivalent energy (less than 1 keV) that the defects are so near the surface that the surface acts as a sink for the defects and that they all migrate to the surface and evaporate.

The extremely high beam currents, e.g., as high as 50 mA of boron equivalent have been demonstrated, coupled with the close proximity of all 40 of the particles from $B_{18}H_{22}$ results in a substantial overlap of the damage cascades thus forming a buried liquid layer which dissolves the end of range damage. The material remains amorphous because the liquid-solid interface moves at very high velocity. It is well known from laser annealing that if the liquid-solid interface exceeds a threshold velocity the solid from will be amorphous and not crystalline. If this happens for laser anneal where the times for re-crystallization are in the order of milliseconds, it is quite certain that it will happen in the cascade where the times are on the order of $10^{-12}$ seconds. See, for example, Phys. Rev. Lett. 50, 896-899 (1983)[Issue 12—March 1983] Silicon Melt, Regrowth, and Amorphization Velocities During Pulsed Laser Irradiation Michael O. Thompson and J. W. Mayer Department of Material Science, Cornell University, Ithaca, N.Y. 14853 A. G. Cullis, H. C. Webber, and N. G. Chew Royal Signals and Radar Establishment, Malvern, Worcestershire WR143PS, United Kingdom J. M. Poate and D. C. Jacobson Bell Laboratories, Murray Hill, N.J. 07974

The large number of hydrogen atoms implanted along with the dopant atoms or the carbon atoms play some role in either generating defect free regions or in some way passivating the defects so as to allow the end of range defects to be annealed.

DESCRIPTION OF THE DRAWING

These and other advantages of the present invention will be readily understood with reference to the following specification and attached drawing, wherein.

DETAILED DESCRIPTION

Cluster Ion Technology

Figure 1:
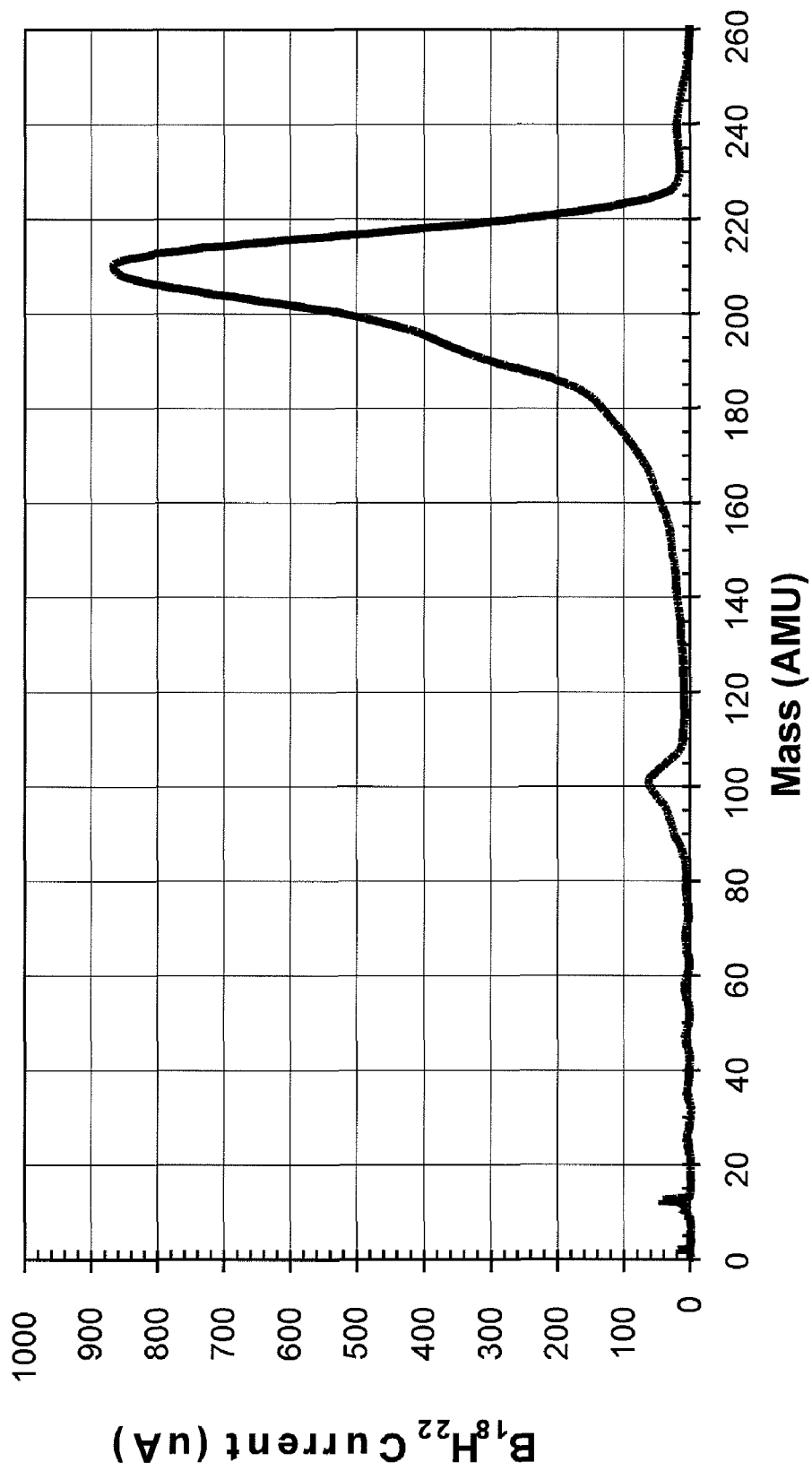
FIG. 1 is an ion mass spectrum of $B_{18}H_{22}$ using a boron cluster source with an extraction voltage of 20 kV.

The present invention to a method of semiconductor manufacturing in which doping is accomplished by the implantation of ion beams formed from ionized molecules, and more particularly to a method in which molecular and cluster dopant ions are implanted into a substrate with and without a co-implant of non-dopant cluster ion, such as a carbon cluster ion, wherein the dopant ion is implanted into the amorphous layer created by the co-implant in order to reduce defects in the crystalline structure, thus reducing the leakage current and improving performance of the semiconductor junctions. In particular, a new implant technology has been developed as an alternative for low energy boron implant. The concept of this technology is to use a molecular ion which contains many boron atoms to avoid the fundamental issues with conventional ion implantation of low energy boron. A new chemical, octadecaborane $B_{18}H_{22}$, may used as the source of this molecule, boron cluster, and a new ion source has been developed to allow its utilization, for example, as disclosed in commonly owned co-pending U.S. patent application Ser. No. 10/519,699, filed on Sep. 14, 2005, entitled "Ion Implantation Device and a Method of Semiconductor Manufacturing by the Implantation of Boron Hydride Cluster Ions", hereby incorporated by reference. It has been found that the implantation of boron clusters has additional advantages in terms of self-amorphization and elimination of crystal defects. Further, additional species with similar properties have been demonstrated, especially two molecules for delivering carbon.

Introduction

One of the challenges of scaling semiconductor technology is the need to constantly reduce junction depths as areal features are scaled. It is particularly challenging to scale the p-type junction depth because the ion implant equipment used throughout the industry is fundamentally unable to operate in the parameter regime necessary to produce the desired junctions. This problem has been avoided in recent technology nodes by evolving the annealing technology such that the reduction of implant energy has been delayed. With the advent of millisecond annealing technologies, there is no longer any opportunity to push annealing any further and the implant energy must be reduced. In this paper, a new implant technology is presented which directly solves the fundamental implant issues and provides a production worthy technology capable of satisfying scaling needs for the foreseeable future.

Cluster or Molecular implantation

The basis concept of this new technology is the use of molecular ion species which contain more than one dopant atom. Conventional implant technology has always utilized ion species which contain only one dopant atom per ion. By using a species with "n" dopant atoms per electronic charge, the implant equipment operates at n times higher extraction voltage and thereby avoids the fundamental physics limitations of forming an ion beam at low extraction voltage. When this ion species enters the silicon wafer, the molecule dissociates and each atom behaves exactly as a conventionally implanted atom would with atomic energy equal to the mass fraction of the total ion energy. It is noted that all atoms get exactly the same fraction of the ion's energy, so there is no variation in the implant process results compared to implants performed by single atom ions. In this way, low energy boron implant processes can be performed on a conventional ion implanter with high productivity.

Boron Cluster

A new chemical has been developed as a source of molecules which contain many boron atoms. The chemical is a boron cluster, and it's constitution is $B_{18}H_{22}$. This chemical is used to produce an ion beam of species $B_{18}H_x^+$ which is found to be very useful for the range of low energy boron implants required for technology nodes at 65 nm and smaller. For example, a 500 eV equivalent boron implant is performed with an extraction voltage of 10 keV using $B_{18}H_x^+$, a very comfortable range to operate any implantation system. This material is a solid at room temperature, which is beneficial for moderating the toxicity of this hydride material, but required the development of a new vaporizer technology for providing $B_{18}H_{22}$ to the ion source. Fortunately, the material vaporizes in the range of 90-100° C., allowing engineering solutions with high accuracy and reliability. At the other end, the material decomposes above 200° C. Again, engineering solutions are easily able to operate in this temperature range with high robustness and moderate cost since the hardware can be fabricated from aluminum.

Boron Cluster Source

In order to form an ion beam of boron cluster, a new ion source was developed, as disclosed, for example by T. N. Horsky, Proc. 16$^{th}$ International Conference on Ion Implant Technology, p159 (2006), hereby incorporated by reference. The basic concept of conventional ion sources is to break apart molecules to isolate the desired single atoms, and thus they operate with high temperature, high density plasmas as the basic ion excitation. In contrast, the boron cluster source is designed to preserve the large molecule and so operates at low temperature with "soft ionization". The excitation for ionization is a low energy electron beam (~50 mA of ~300 eV electrons) which are generated remotely from the process vapor and transported to the region of ionization. In this way, a column of ionized vapor is created parallel and adjacent to the extraction slot, allowing for high efficiency extraction of the $B_{18}H_x^+$ ions. This soft ionization system has been demonstrated to be effective at ionizing the boron cluster vapor, and currents as high as 3 mA of $B_{18}H_x^+$ ions have been achieved. The mass spectrum of the generated ion beam is shown in FIG. 1, where it is seen that the dominant ion created is the $B_{18}H_x^+$ ion. The only other beam components are a small amount of doubly charged ($B_{18}^{++}$) and very small amounts of $B^+$ and $H^+$. In particular, FIG. 1 is a mass spectrum of $B_{18}H_{22}$ using the boron cluster source with an extraction of 20 keV.

Process Features

While initially developed as a productivity solution, it has been found that boron cluster implants have several unique and potentially beneficial features. Of course, the low energy productivity has been realized, with beam current capability of 50 mA at 3 keV, as demonstrated by T. N. Horsky, G. F. R. Gilchrist, R. W. Milgate, Proc. 16th International Conference on Ion Implant Technology, p198 (2006), hereby incorporated by reference. This capability translates into high productivity for extremely low energy implants also, with mechanical limit capability down to 500 eV and production worthy capability down to 100 eV. This low energy capability is provided from a conventional ion implanter with only slight modifications to utilize the $B_{18}H_{22}$ species. The boron cluster implants are always performed in drift mode, and thereby avoid any energy contamination. Energy contamination is a result of the use of deceleration mode, which all conventional implantation systems employ to increase productivity for low energy implants. While the amount of energy contamination in a decelerated beam is generally low (<1%), it is variable with tuning and implanter condition and is less tolerable as technology scales. The combination of production worthy capability at extremely low energies and no energy contamination makes $B_{18}H_{22}$ very attractive for the SDE implant at the 45 nm technology node and beyond.

Self-Amorphization

Figure 2:
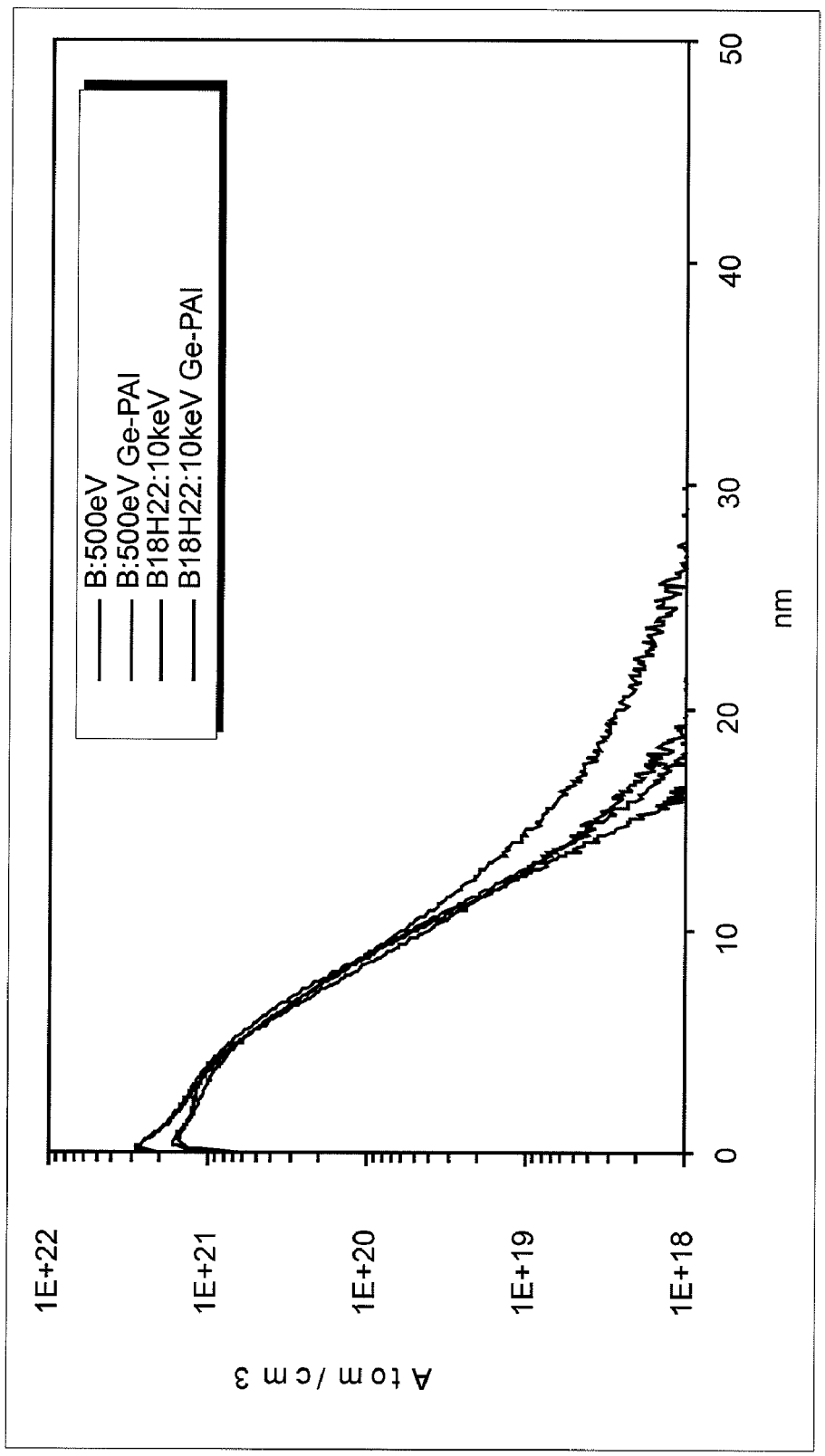
FIG. 2 represents SIMS profiles of $B_{18}H_x^+$ and monomer B$^+$ implants with and without a Ge PAI process. Slight channeling is observed for the $B_{18}H_x^+$-only implant.

With the implantation of such a large cluster of boron atoms, it was expected that the damage profile created would be different than a conventional monomer boron implant. There have now been many studies of the damage generated which lead to the concept of self-amorphization, starting with the work of Borland, et al. (J. O. Borland, Proc. 16th International Conference on Ion Implant Technology, p. 6 (2004), hereby incorporated by reference). The studies have shown that the $B_{18}H_x^+$ implant itself creates an amorphous layer at relatively low dose and that this amorphous layer allows the $B_{18}H_x^+$ implant to avoid most channeling without the use of an additional PAI implant. The studies have shown that the cluster impact on the silicon lattice imparts its momentum preferentially near the surface, relative to a monomer implant of equivalent parameters. This enhances the silicon damage at the surface while minimizing damage in-depth. Thus, a shallow amorphous layer is formed at the surface at a low dose, which is sufficient for eliminating channeling of the subsequent cluster implant. For $B_{18}H_x^+$, the threshold of amorphization is around $1E14/cm^2$ dose, so a typical SDE implant would be 90% unchanneled. An example of the SIMS profile obtained by a $B_{18}H_x^+$ implant is shown in FIG. 2, where profiles are shown with and without PAI and monomer boron is shown with and without PAI. In particular, FIG. 2 illustrates SIMS profiles of $B_{18}H_x^+$ and monomer $B^+$ implants with and without a Ge PAI process. Slight channeling is observed for the $B_{18}H_x^+$-only implant. It is seen that most of the channeling has been avoided, although there remains some channeling effect. The self-amorphization process is discussed in more detail below.

Carbon cluster molecules, such as, $C_{16}H_{10}$ and $C_7H_7$, provide a means of studying the damage creation mechanism with the same chemistry and are providing interesting results, for example, as reported by K. Sekar, W. A. Krull, T. Horsky, D. C. Jacobson, K. Jones, D. Henke, Proc. of International Conference on INSIGHT in Semiconductor Device Fabrication, Metrology and Modeling, May 6-9, Napa, USA (2007), hereby incorporated by reference. Notably, it is seen that much higher doses are needed to achieve amorphization with the smaller carbon cluster, so the damage deposition at the surface is strongly mass dependent.

Elimination of EOR Damage

Figure 3:
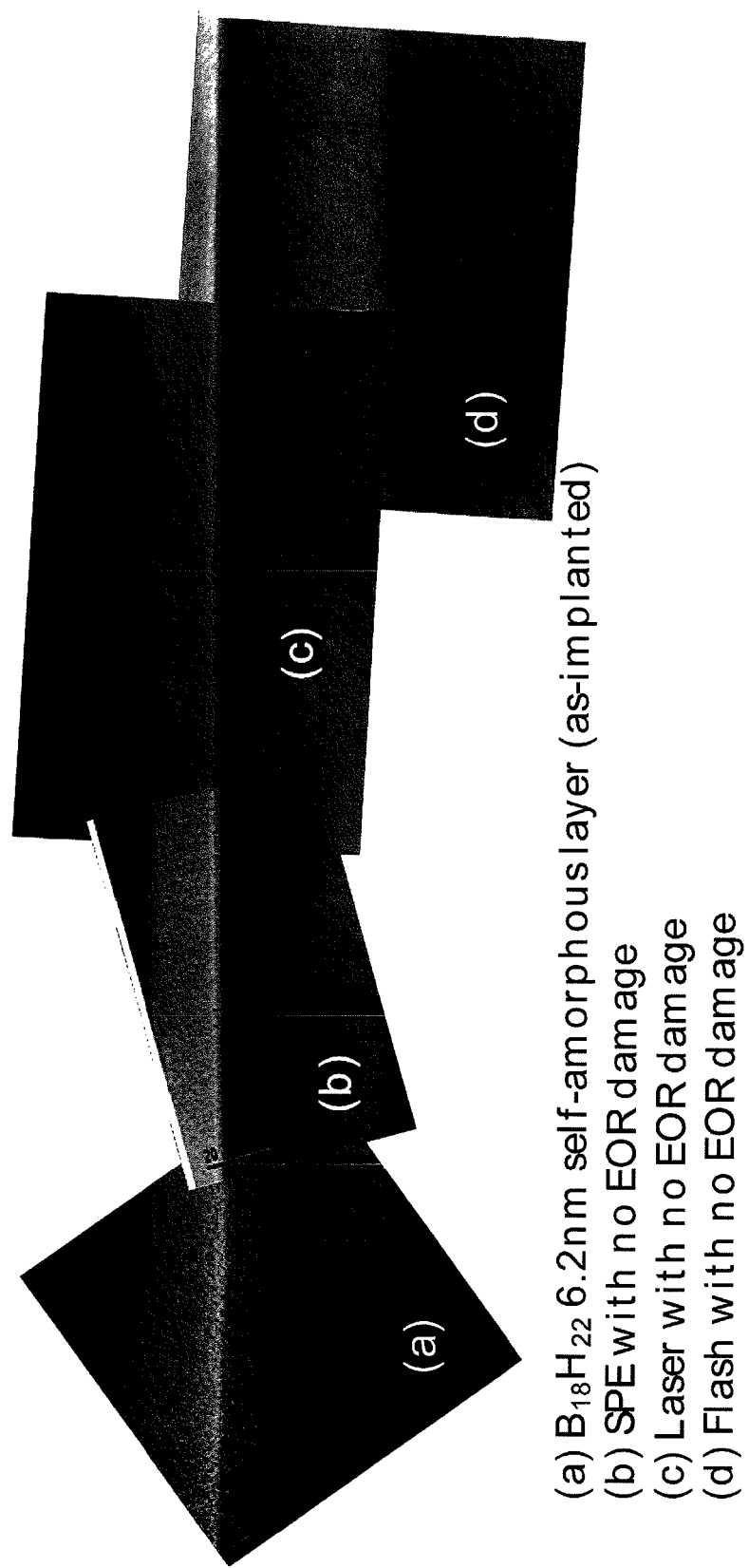
FIG. 3 represents XTEM images of $B_{18}H_x^+$ implants as-implanted and with laser, flash and SPE anneals. No crystal defects are seen in any of the annealed structures.

A further result of the different damage deposition process with a boron cluster implant relates to the end of range (EOR) damage and its annealing behavior. With any amorphizing implant, a major issue emerges with the requirement of completely annealing the total structure and eliminating all silicon crystal defects to achieve a low leakage junction. Since the amorphous region is by definition high damaged, it is expected that the silicon crystalline region immediately below the amorphous layer is also heavily damaged, and this is what is commonly referred to as EOR damage. It is noted that the conventional process using a $Ge^+$ implant produces significant EOR damage which is challenging to anneal completely, especially with advanced, low thermal budget annealing technologies. In contrast, the EOR damage created by the cluster implant is found to be less troublesome, with many studies now reporting that defect-free junctions are achieved, even with the most modern low thermal budget anneal technologies. FIG. 3 shows some results from the work of, J. O. Borland, Proc. 16th International Conference on Ion Implant Technology, p6 (2004), hereby incorporated by reference, where the $B_{18}H_x^+$ implant is shown to be defect-free with very advanced anneal conditions; flash, laser and SPE. In particular, FIG. 3 represents XTEM images of $B_{18}H_x^+$ implants as-implanted and with laser, flash and SPE anneals. No crystal defects are seen in any of the annealed structures.

Figure 4:
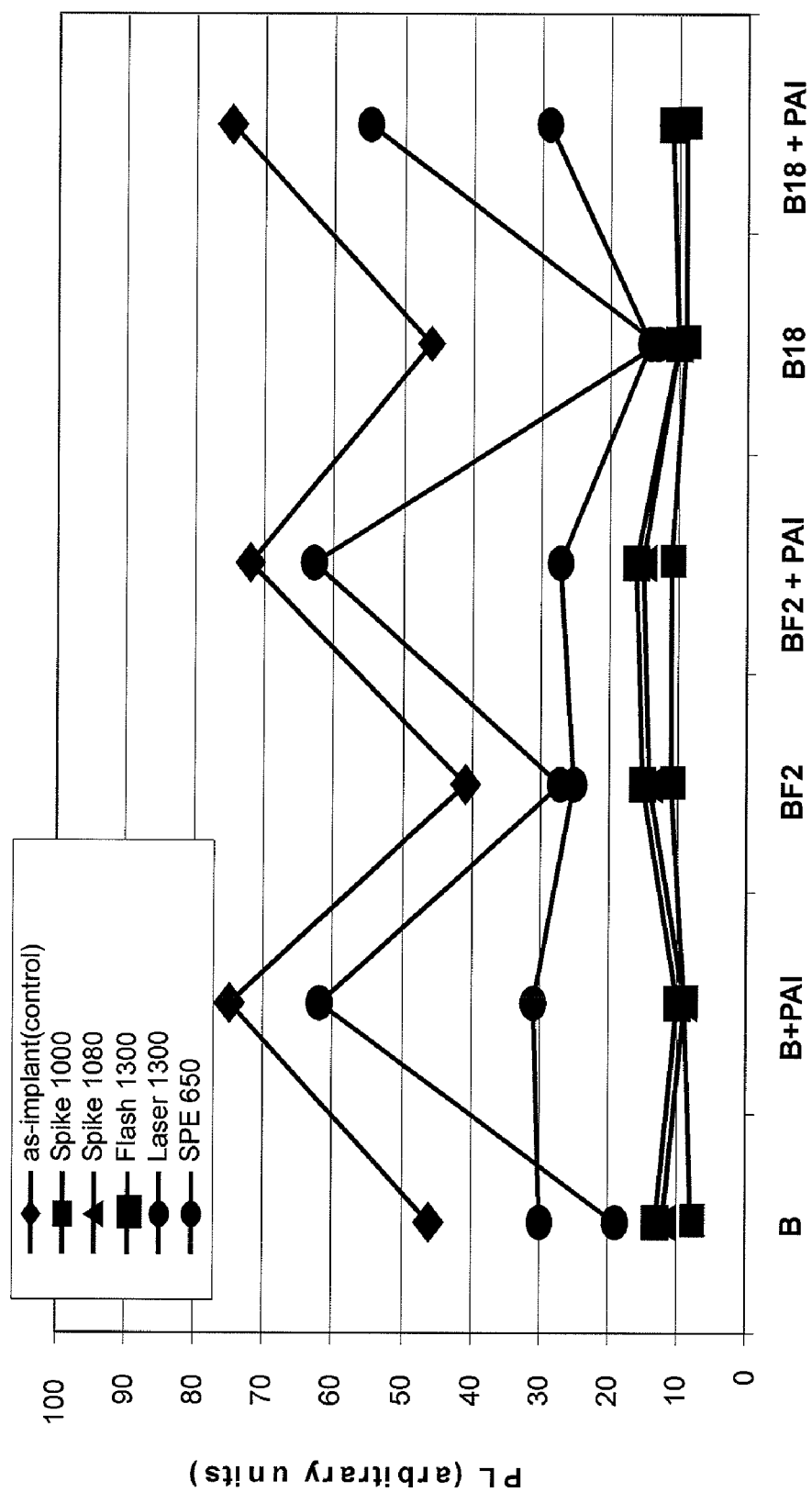
FIG. 4 illustrates photoluminescence data for B$^+$, BF$_2^+$, and $B_{18}H_x^{30}$-implanted samples with and without a Ge PAI for various annealing steps.
Figure 5:
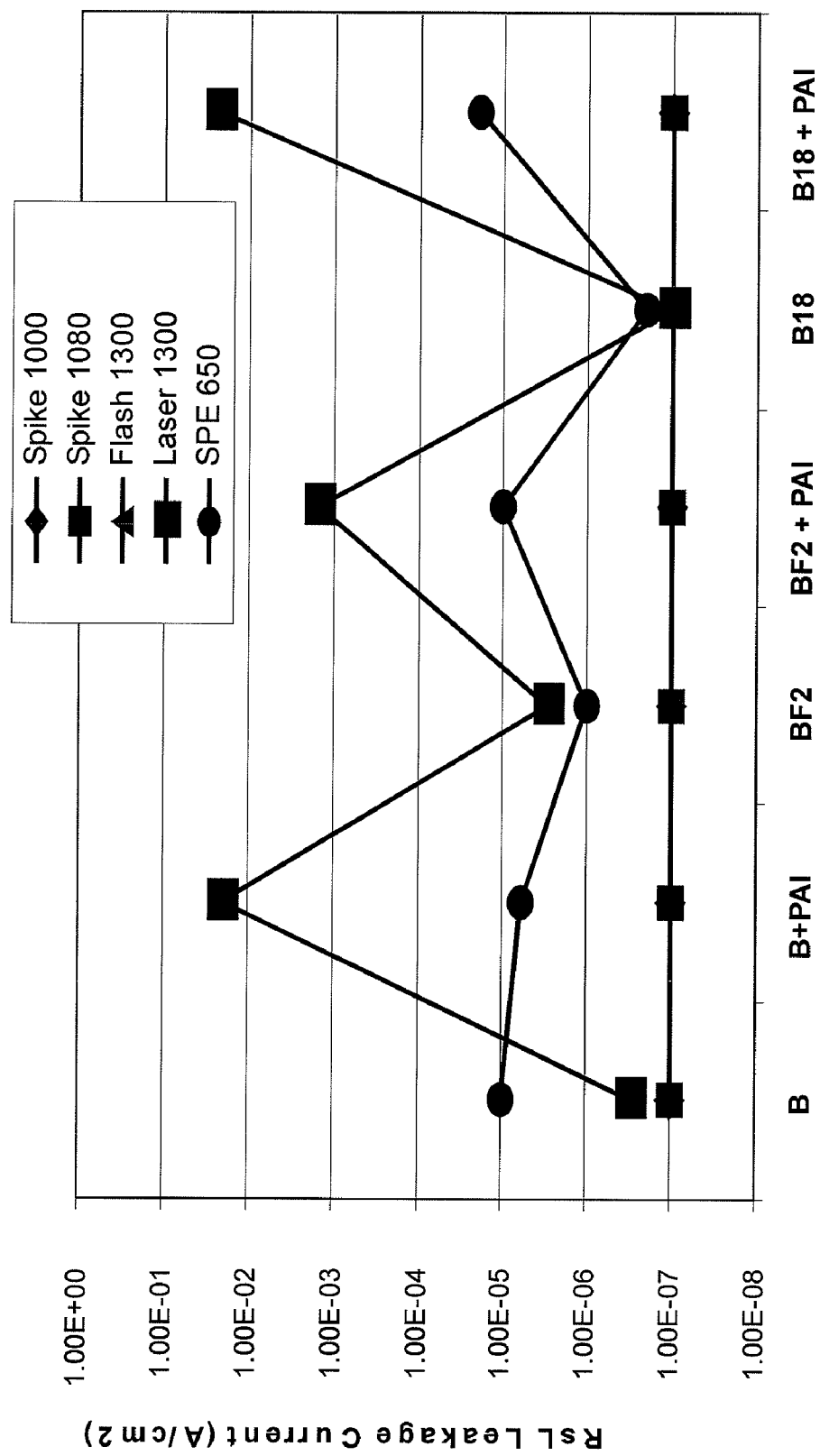
FIG. 5 shows junction leakage as determined by the Frontier Semiconductor method, as a function of implant process and anneal conditions. $B_{18}H_x^+$ is shown to produce very low levels of junction leakage regardless of which anneal condition is chosen.

This work also produced the results shown in FIGS. 4 and 5. In particular, FIG. 4 shows photoluminescence (PL) signal for B, $BF_2$ and $B_{18}H_x^+$ implants with and without PAI and for a variety of annealing technologies. The PL signal indicates the presence of crystal damage, so low numbers are better. It is seen that the $B_{18}H_x^+$ only case produces consistently detection level results with any annealing technology. None of the other approaches to USJ formation produce as consistently low PL numbers. As shown in FIG. 4, the $B_{18}H_x^+$-only process is shown to produce very low PL numbers regardless of which annealing condition is chosen.

FIG. 5 shows the corresponding data for junction leakage, as obtained by the Frontier method. It is remarkable that the structure of the figure is consistent with FIG. 4, showing the correlation between crystal damage and junction leakage. Again, the $B_{18}H_x^+$-only case produced the most consistently low leakage, and achieved detection level leakage with any of the advanced anneal conditions. FIG. 5 illustrates junction leakage as determined by junction photo-voltage measurements, as a function of implant process and anneal conditions. $B_{18}H_x^+$ is shown to produce very low levels of junction leakage regardless of which anneal condition is chosen.

Carbon Cluster Co-Implant

With the understanding that cluster implants have fundamental benefits for semiconductor applications, carbon cluster species have expanded the options. Hydrocarbon molecules were selected to have very similar physical properties to the boron cluster material, and are found to work very well with the same boron cluster system. Two carbon species have been developed to address different process energy ranges, $C_{16}H_{10}$ and $C_7H_7$. The $C_7H_7$ species allows implant processes with carbon energies up to 10 keV per carbon atom, allowing carbon cluster solutions to the entire range of useful carbon implants.

Diffusion Control

Figure 6:
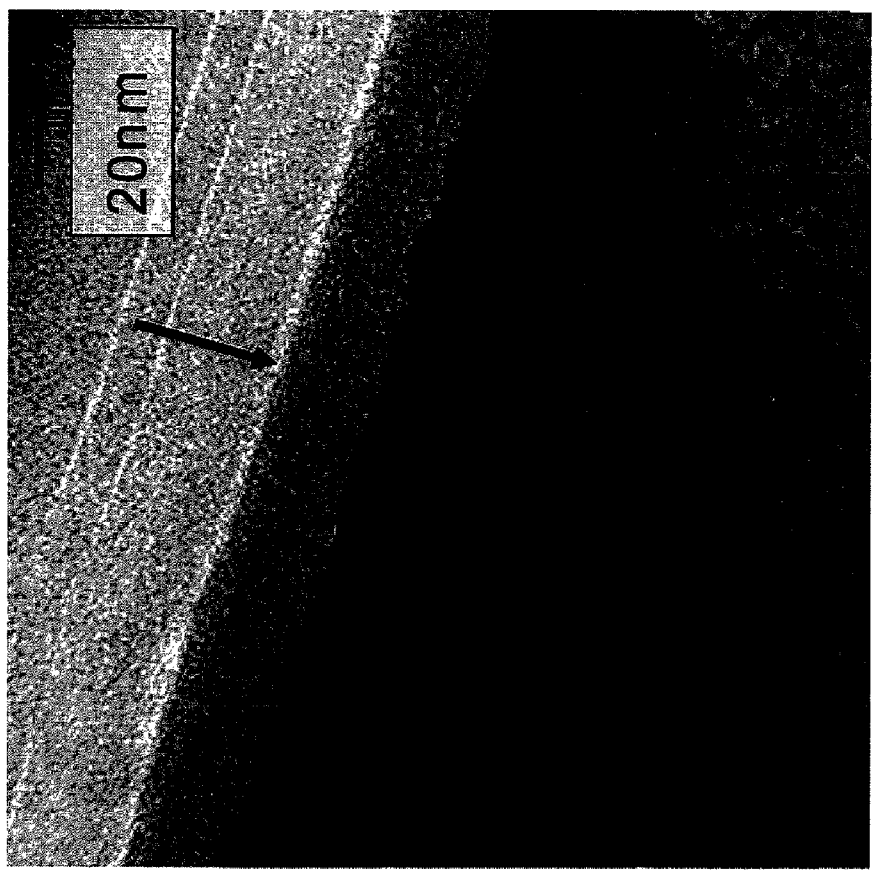
FIG. 6 is a XTEM image of carbon cluster as-implanted structure showing an auto-amorphization layer of 14 nm thickness. Implant conditions were 3 keV per carbon atom and a dose of 1E15/cm$^2$ carbon. The arrow indicates the position of the surface.
Figure 7:
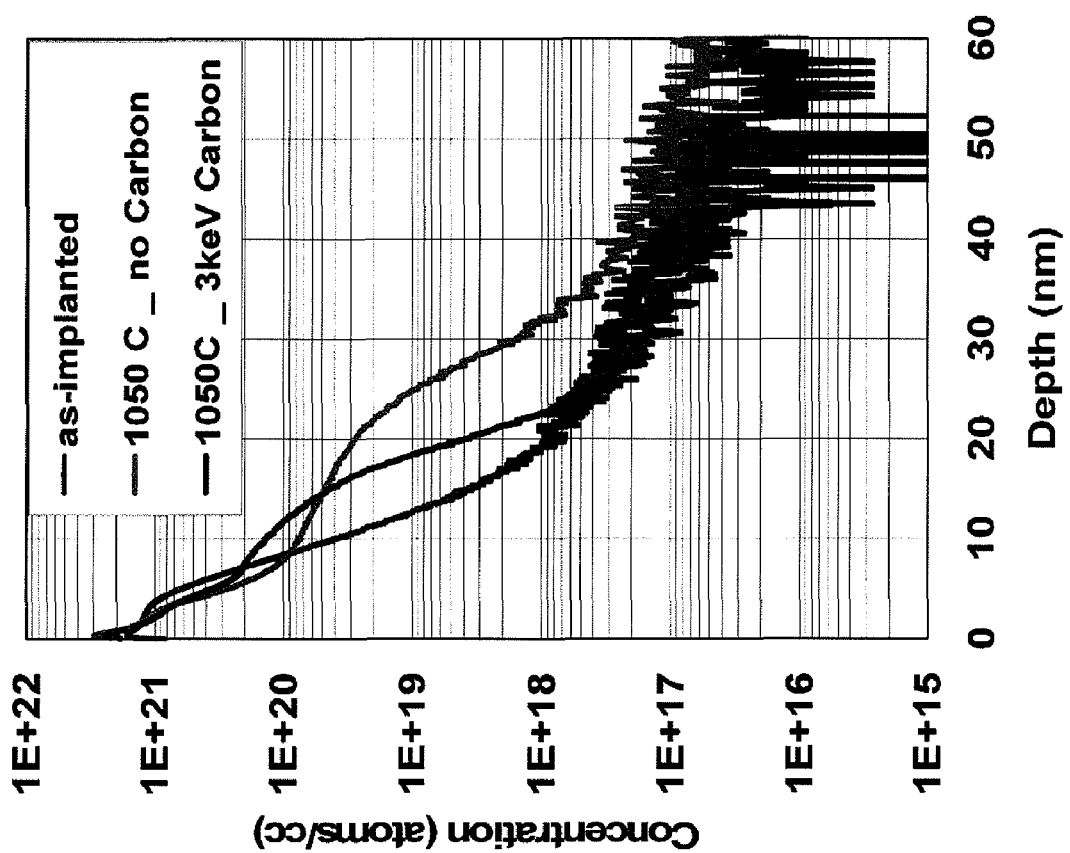
FIG. 7. is a SIMS profiles showing the benefit of a carbon cluster in controlling the diffusion of boron ($B_{18}H_x^+$) implant. As-implanted, without carbon and with carbon profiles are shown.
Figure 8:
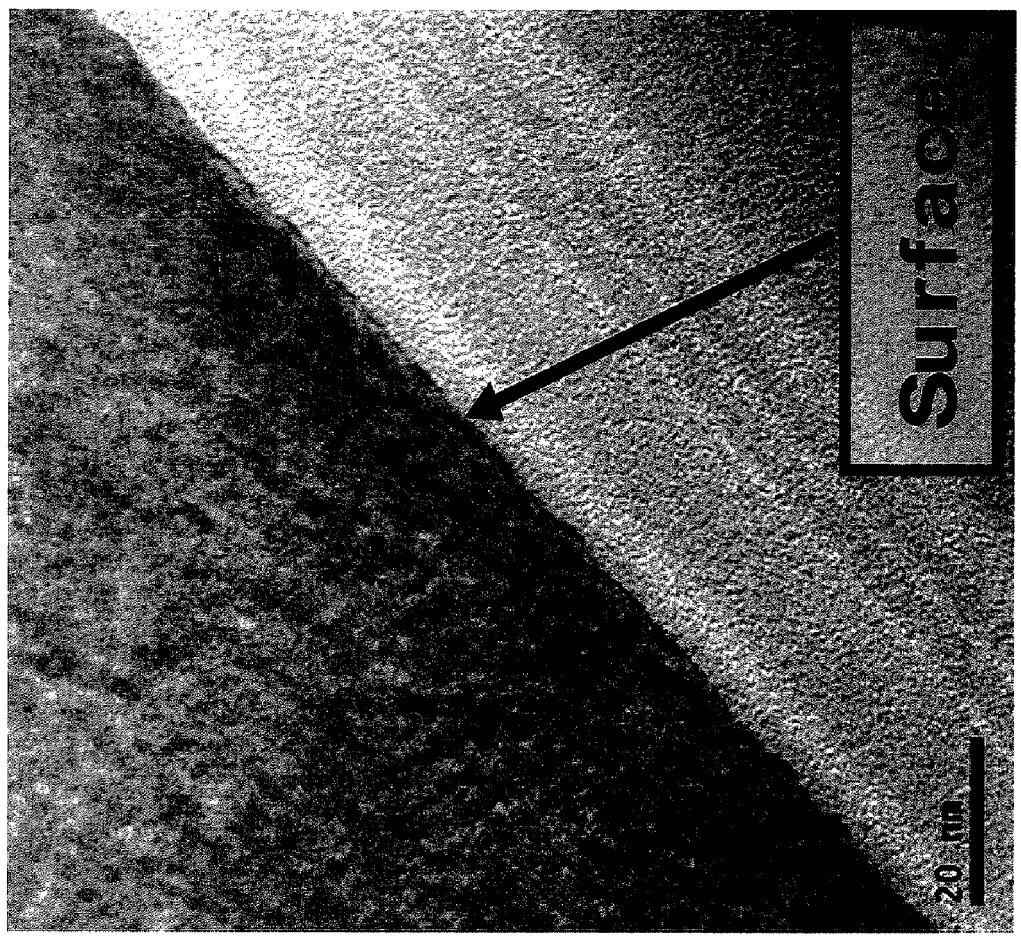
FIG. 8 is an XTEM image showing no EOR damage after an 5 sec anneal at 1025° C. for $B_{18}H_x^+$ implanted at 500 eV per boron atom preceded by a 3 keV per carbon atom $C_{16}H_x^+$ implant, both at 1e15 atoms/cm$^2$.

The most advanced process application of carbon in modern CMOS processing is for boron diffusion control. Many organizations are using carbon in this role at the 45 nm technology node. The action of carbon is well known: reduction of boron diffusion, improvement of the abruptness of the boron profile, and increase of the boron solid solubility. These features are all achieved with carbon cluster also. The conventional process is typically Ge/C/B since it is required that the active volume where carbon acts is amorphous prior to anneal. FIG. 6 illustrates a TEM of the carbon cluster implant showing that it has the feature of self-amorphization which is critical to the diffusion control process. More particularly, FIG. 6 is a XTEM image of carbon cluster as-implanted structure showing a self-amorphization layer of 14 nm thickness. Implant conditions were 3 keV per carbon atom and a dose of 1E15/cm² carbon. The arrow indicates the position of the surface. FIG. 7 illustrates that the carbon cluster/sequence behaves like the conventional cocktail implant process. In particular, FIG. 7 is a SIMS profiles showing the benefit of a carbon cluster in controlling the diffusion of boron ($B_{18}H_x^+$) implant. As-implanted, without carbon and with carbon profiles are sown. Further, it has been found that the cluster sequence also have the benefit previously mentioned of elimination of EOR defects. FIG. 8 is a TEM image of the carbon cluster/boron cluster implant sequence process post anneal and illustrates that no crystal defects remain. More particularly, FIG. 8 is a XTEM image showing no EOR damage after an 5 sec anneal at 1025° C. for (CB/CC) [$B_{18}H_x^+$ 500 eV per boron atom+$C_{16}$ 3 keV per carbon atom] both at 1e15 atoms/cm².

Stress Engineering

Figure 9:
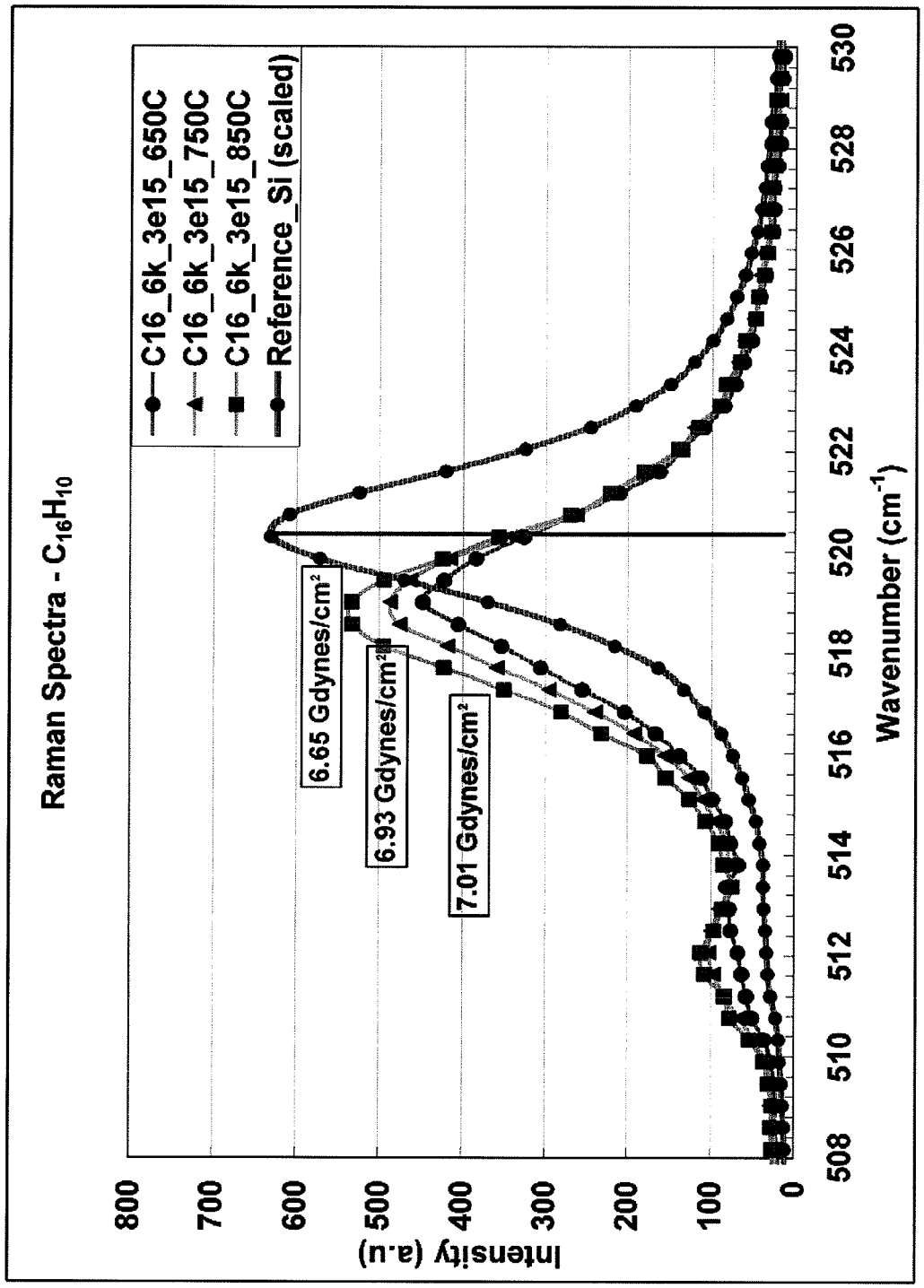
FIG. 9 illustrates Raman spectroscopy results showing stress generated by carbon cluster implant after anneal.
Figure 10:
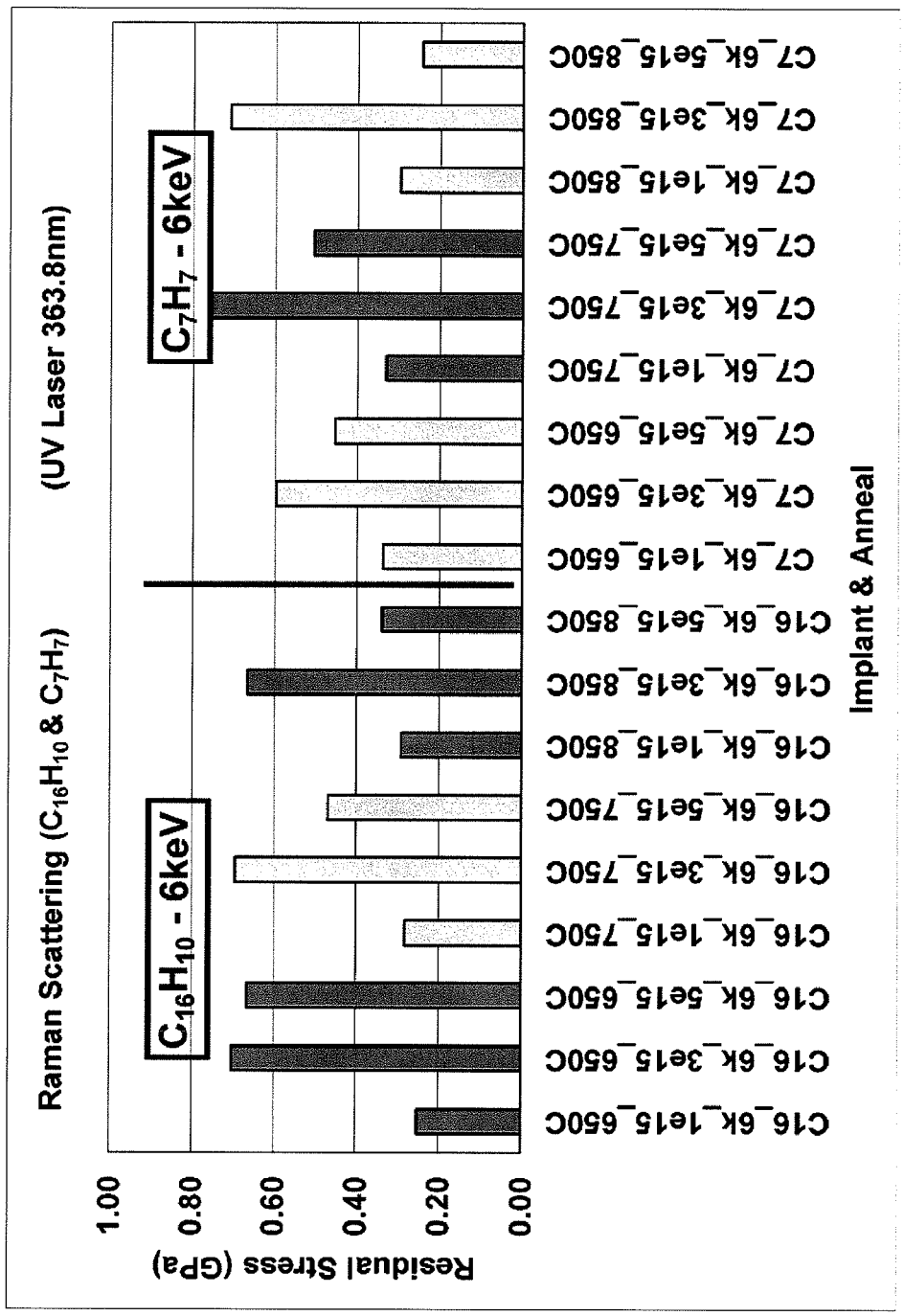
FIG. 10 illustrates stress data for various carbon cluster implant conditions and anneal conditions. Both $C_{16}H_x^+$ and $C_7H_x^+$ implants are shown to produce similar levels of stress. Data by UV Raman spectroscopy.

Recent developments of CMOS solutions for advanced technology nodes have focused largely on incorporating stress into the channel to improve mobility. This has been remarkably successful at improving the performance of the PMOS transistor by incorporating SiGe source and drain structures to place the PMOS channel under compressive stress. Stress engineering of the NMOS has been less successful, but much effort is currently in progress to use nitride structure to achieve tensile stress of the NMOS channel. Another potential method of achieving improvement of the NMOS is to use SiC alloys in the source and drain to create the proper tensile stress on the channel. These epitaxial deposition methods under development are challenging. The present invention provides a new alternative: the use of a carbon cluster implant to create the SiC alloy material with a simple and direct process. In particular, the present invention provides process recipes which have been shown to produce high degress of stress in blanket layers, as measured by Raman spectroscopy, as shown in FIG. 9. In particular, FIG. 9 is a Raman spectroscopy results showing stress generated by carbon cluster implant. It is found that the self-amorphization feature of the carbon cluster implant is very beneficial to the success of this process: the recrystallization of the amorphous layer directly promotes placing the carbon into substitutional sites, which is required to achieve the proper stress. FIG. 10, illustrates stress results that have been achieved with stress values as high as 800 MPa. More particularly, FIG. 10 illustrates stress data for various carbon cluster implant conditions and anneal conditions. Both $C_{16}H_{x+}$ and $C_7H_x^+$ implants are shown to produce similar levels of stress. Data by UV Raman spectroscopy.

Benefits Summary

Cluster ion technology in accordance with the present invention provides a production solution for the implantation of large molecules containing many atoms of the desired species, rather than the conventional method of implanting one atom at a time. It has been shown that this technology provides very high productivity for low energy implants while also producing process benefits. These process features include lack of energy contamination, self-amorphization and easy elimination of EOR damage, producing defect-free structures with low junction leakage. Boron cluster and carbon cluster species are utilized with direct application to the conventional uses of low energy boron and carbon implants. In addition, a new application for NMOS stress engineering has been described for the carbon cluster implant.

Experimental Results

Wafers used were 200 mm, n-type, (100) silicon substrates. The wafers were implanted with different cluster species at various energies and doses using boron cluster and carbon cluster materials fed into a cluster ion source, and producing beams of $B_{18}H_x^+$, $C_{16}H_x^+$, and $C_7H_x^+$ ions. This ion source technology preserves these large molecules through a soft-ionization process. The implants were performed on an Axcelis GSD high-current implanter retrofit with an ion source, such as disclosed in co-pending commonly owned U.S. patent application Ser. No. 10/519,699, filed on Sep. 14, 2005, entitled "Ion Implantation Device and a Method of Semiconductor Manufacturing by the Implantation of Boron Hydride Cluster Ions", hereby incorporated by reference.

Figure 11B:
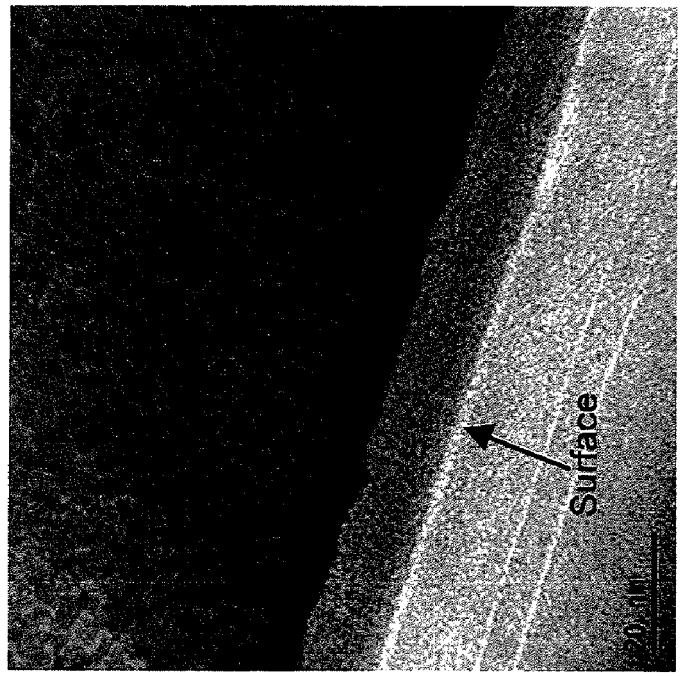
FIG. 11B shows a 1E15, 3 keV per carbon $C_{16}H_x^+$ implant which produced a 14 nm amorphous layer.
Figure 11A:
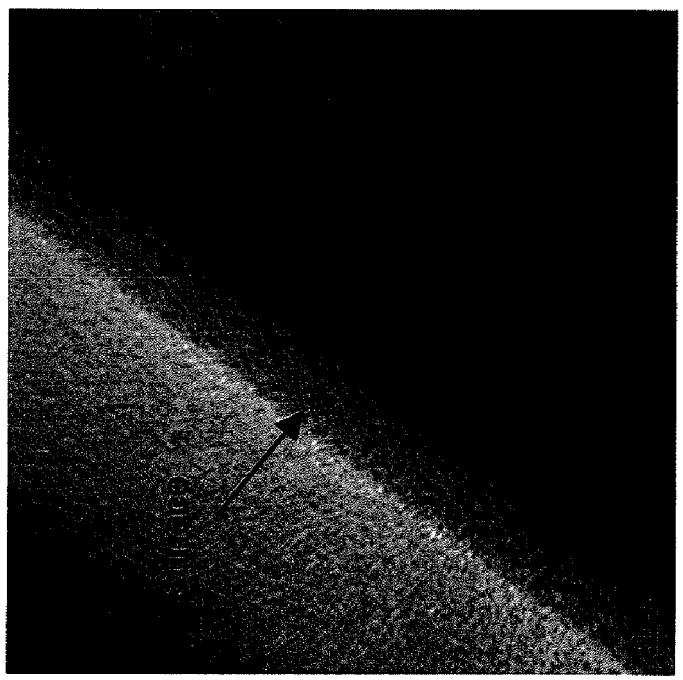
FIG. 11A shows a transmission TEM after a 1e15, 500 eV per boron $B_{18}H_x^+$ implant into a silicon wafer. The implant produced a 6.2 nm amorphous layer.
Figure 12:
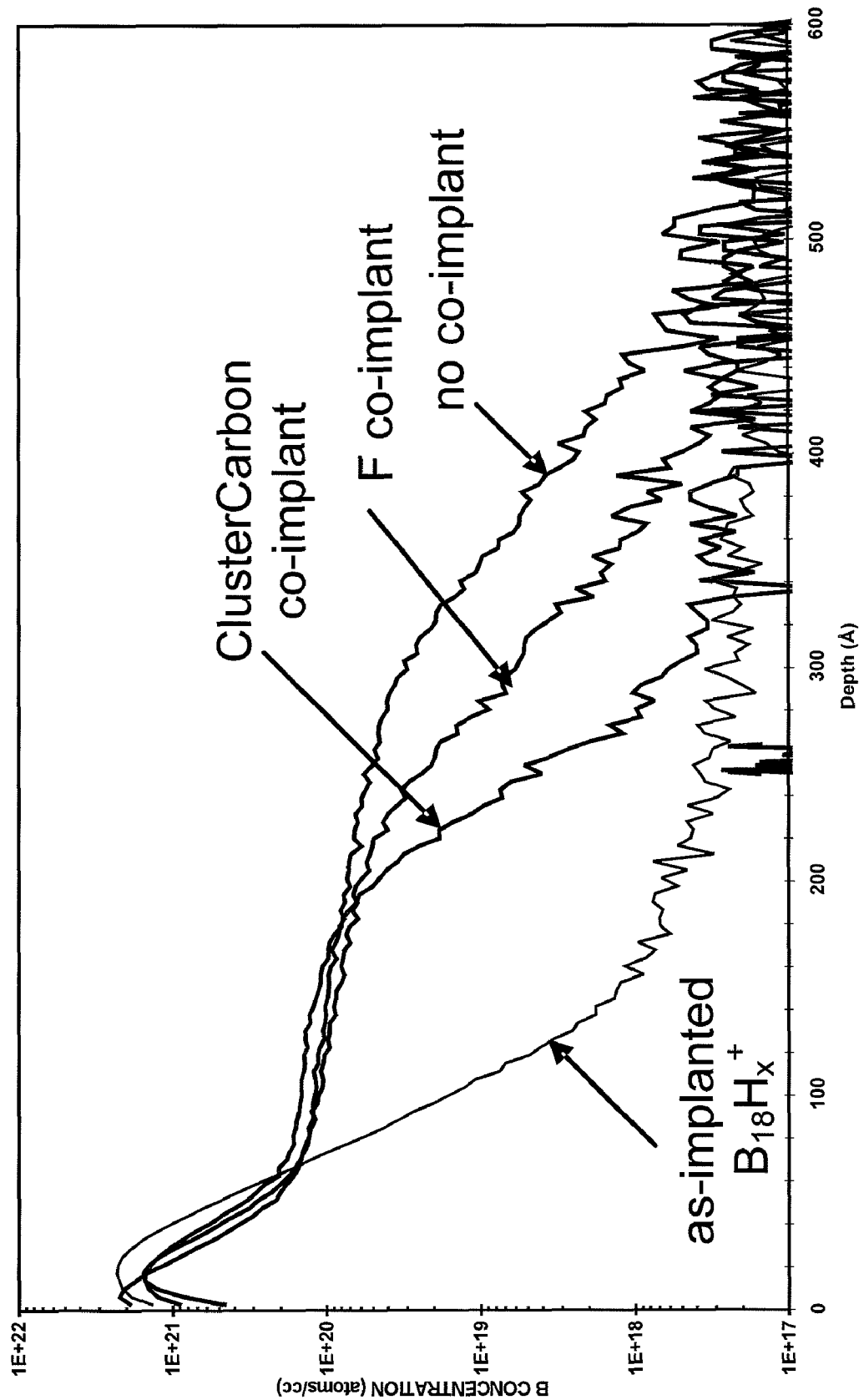
FIG. 12 shows SIMS profiles comparing the as-implanted boron profile after a 300 eV per boron $B_{18}H_x^+$ implant to annealed samples which had also been implanted with either fluorine or carbon cluster for diffusion control.

FIGS. 11A and 11B illustrate the amorphization benefits of implanting with clusters. The implantation depths associated with the 500 eV boron implant and 3 keV carbon implant are appropriate for using them in combination to reduce diffusion in USJ formation. FIG. 12 shows SIMS profiles comparing the as-implanted boron profile after a 300 eV per boron $B_{18}H_x^+$ implant to annealed samples which had also been implanted with either fluorine or carbon cluster for diffusion control. The carbon cluster+boron cluster implant yields a much more shallow and abrupt junction than either $B_{18}H_x^+$ alone or $B_{18}H_x^+$+F.

Figures 13A, 13B, 13C:
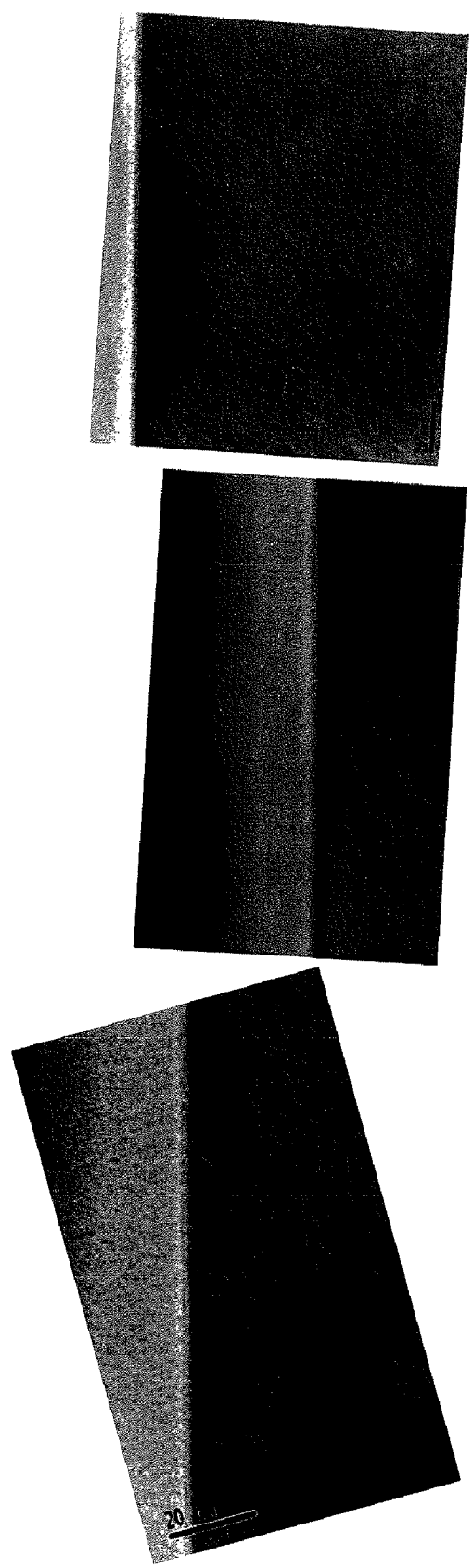
FIG. 13A shows cross-section transmission electron micrographs (X-TEM) of $B_{18}H_x^+$-implanted and annealed samples demonstrating the lack of defects for SPE anneal.
FIG. 13B is similar to FIG. 13A but for a laser.
FIG. 13C is similar to FIG. 13A but for a flash anneal.
Figure 14C:
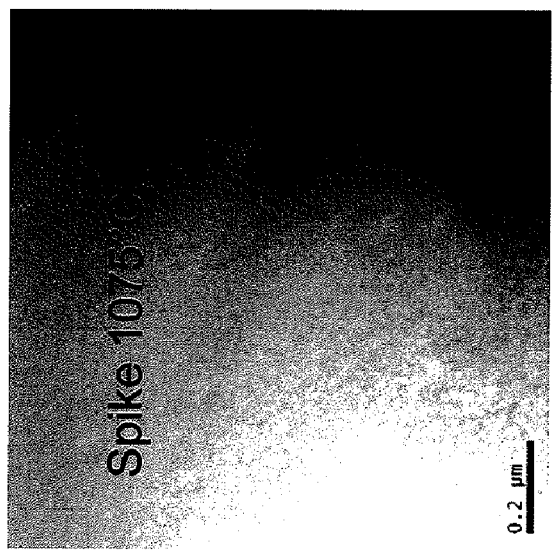
FIG. 14A shows plan view TEM's of 500 eV per boron, 1e15 $B_{18}H_x^+$-implanted samples after a 650 C SPE anneal.
FIG. 14B is similar to FIG. 14A except after 720 C SPE anneal.
FIG. 14 C is similar to FIG. 14A except after 1075 C spike anneal.
Figure 14B:
Figure 14A:
Figures 15A, 15B:
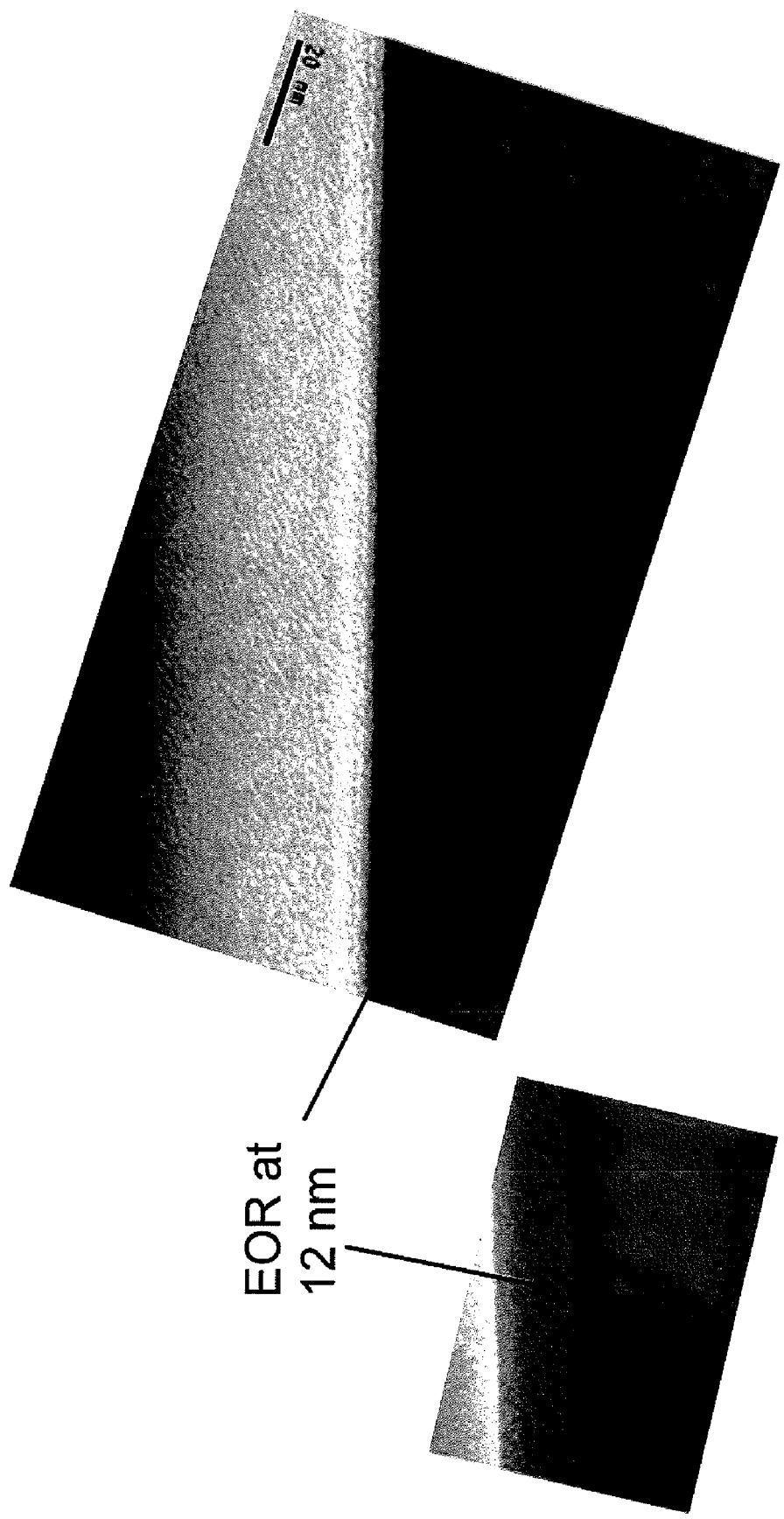
FIG. 15A shows X-TEM's for Ge pre-amorphized, $B_{18}H_x^+$-implanted samples before anneal.
FIG. 15B is similar to FIG. 15A except after a 5 s, 950 C anneal on an Axcelis Summit™ RTP system.
Figure 16B:
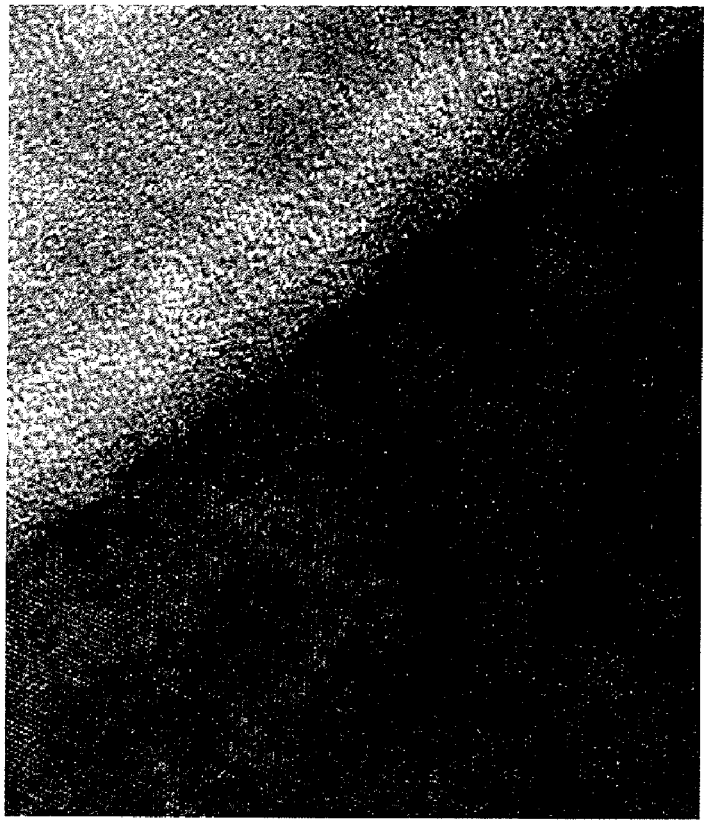
FIG. 16B is similar to FIG. 16A except on a 5 nm scale.
Figure 16A:
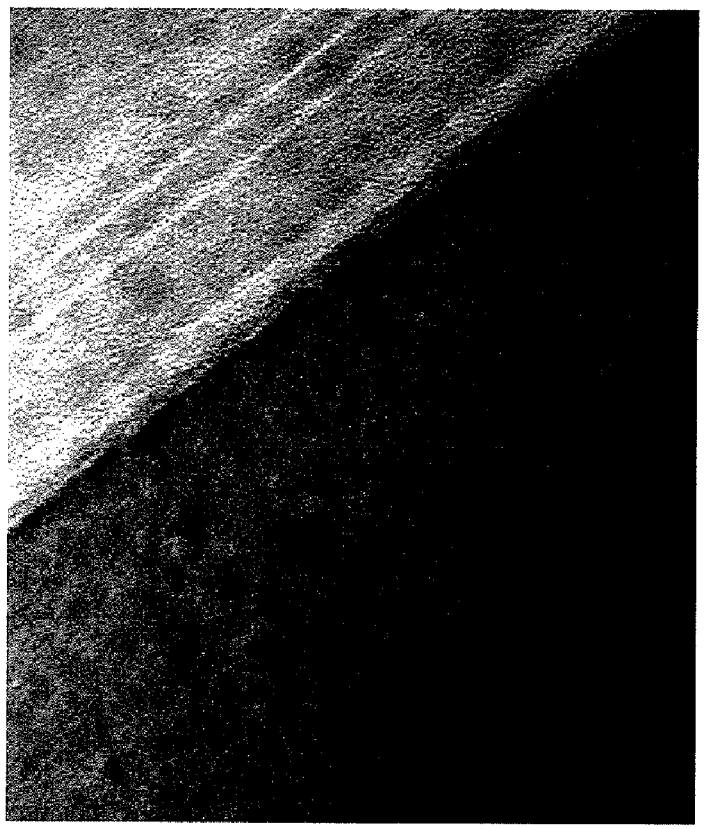
FIG. 16A shows annealed X-TEM images of samples implanted first with 1e15, 3 kV per boron $C_{16}H_x^+$ ions, followed by a 1e15, 500 eV per boron $B_{18}H_x^+$ implant appropriate for 65 nm SDE on a 20 nm scale.

FIGS. 13A-13C illustrate cross-section transmission electron micrographs (X-TEM) of $B_{18}H_x^+$-implanted and annealed samples demonstrating the lack of defects for SPE, laser, and flash anneals. SPE was performed at 650 C on a Mattson RTP system. Millisecond flash annealing was performed at 1300 C on a Mattson lamp-based system. Laser anneal was 200 nsec sub-melt conducted as taught by John Borland et al., IEEE Proceedings of the XVI$^{th}$ International Conference on Ion Implantation Technology, Jun. 11-16, 2006, Marseilles, France, pp. 96-100, hereby incorporated by reference. FIG. 14 shows plan view TEM's of 500 eV per boron, 1e15 $B_{18}H_x^+$-implanted samples after (a) 650 C SPE; (b) 720 C SPE; (c) 1075 C spike anneal. Anneals were performed on an ASM Levitor™ system, for example, as disclosed by Klaus Funk, Einladung zum RTP- & Ionenimplantations-Nutzergruppen-Treffen, Villach, Austria, Sep. 25-26, 2006, hereby incorporated by reference. FIG. 15 shows X-TEM's for Ge pre-amorphized, $B_{18}H_x^+$-implanted samples (a) before anneal; and (b) after a 5 s, 950 C anneal on an Axcelis Summit™ RTP system. The EOR defects are clearly shown at a depth of 12 nm, and are still evident after annealing. FIG. 16 shows annealed X-TEM images of samples implanted first with 1e15, 3 kV per boron $C_{16}H_x^+$ ions, followed by a 1e15, 500 eV per boron $B_{18}H_x^+$ implant appropriate for 65 nm SDE. The anneal was a 5 s, 950 C spike performed on an Axcelis Summit™ RTP system.

The creation of low-leakage junctions is enabling for the next generations of mobile devices. A significant contributor to junction leakage is the creation and retention of EOR defects. The Ge PAI produces EOR defects which cannot be annealed out by low-thermal budget anneals, as illustrated by FIG. 15 and as discussed by John Borland et al., IEEE Proceedings of the XVI$^{th}$ International Conference on Ion Implantation Technology, Jun. 11-16, 2006, Marseilles, France, pp. 96-100, hereby incorporated by reference. FIGS.

3 and 4 illustrate that by substituting $B_{18}H_x^+$ for either $BF_2^+$ or $B^+$ in fabricating SDE for PMOS, EOR defects can be eliminated. In addition, FIG. 11A demonstrates that the very implantation of $B_{18}H_x^+$ at doses appropriate for creating SDE creates an amorphous layer which nearly eliminates channeling, as has been previously reported Y. Kawasaki, T. Kuroi, K Horita, Y. Ohno and M. Yoneda, Tom Horsky, Dale Jacobson, and Wade Krull, Nucl. Inst. Meth. Phys. Res. B 237 (2005), pp. 25-29, hereby incorporated by reference.

The use of a carbon co-implant has recently become common to limit boron transient-enhanced diffusion and to produce shallower, more abrupt junctions. Unfortunately, the implantation of C can also introduce EOR defects, thus trading off reduced junction depth for increased leakage. As demonstrated by FIG. 6, the combination of a carbon cluster implant with a boron cluster implant yields defect-free junctions. We are continuing to conduct carbon cluster experiments to better understand the mechanisms for this effect. A picture is emerging which gives insight of why this is so, and why the use of Carbon cluster will be very important to the continued development of USJ manufacturing.

As shown in FIG. 11B, $C_{16}H_x^+$ itself produces an amorphous layer. Thus, the implantation of $C_{16}H_x^+$ can be used as an amorphizing implant. When implanted at the appropriate depth and dose, it also accomplishes effective diffusion control, as shown in FIG. 12. Thus, it can be used in lieu of a C implant whenever diffusion control is desired.

It has been established that the role of carbon in the control of boron diffusion is the gettering of interstitial defects. During TED, boron is thought to pair with interstitials and that this mechanism is responsible for rapid boron movement through the crystal lattice. It may be that the amorphizing effects of carbon in combination with its gettering of interstitials is the reason that the use of carbon cluster in combination with a dopant implant results in a lack of EOR defects after anneal. This reasoning stems from the assumption that if the end of range occurs within amorphous silicon, the resulting defects anneal out more readily that if the end of range occurs in crystalline material. It is very likely that the use of Carbon cluster as an amorphizing implant is also effective in reducing EOR defects in NMOS transistors. Preliminary results of work using carbon cluster as a co-implant with $As_4^+$ implantation at As energies appropriate for SDE has yielded very low defect junctions.

Figure 17:
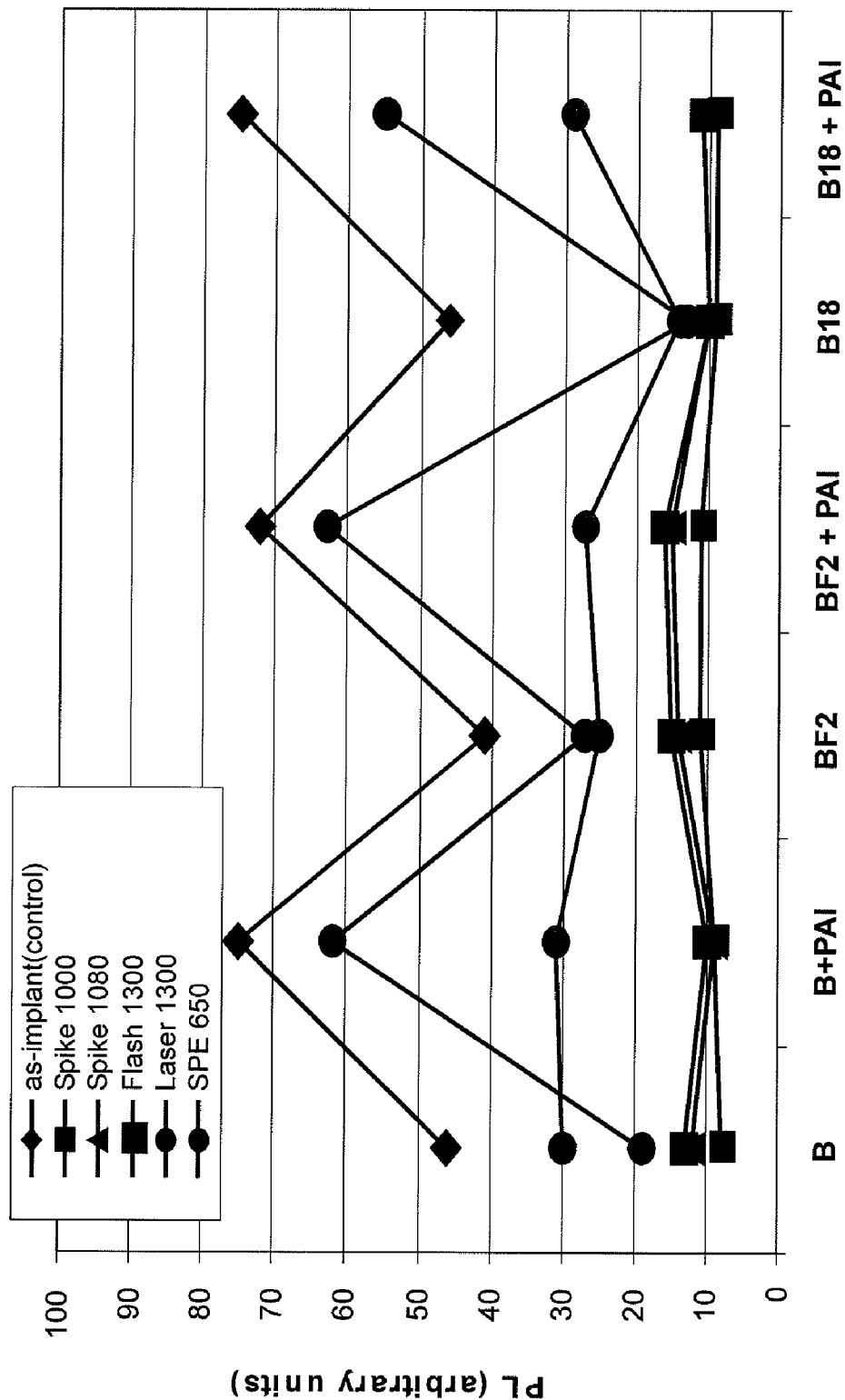
FIG. 17 is a graphical illustration illustrating silicon crystal lattice damage, as measured by a known photoluminescence technique.
Figure 18:
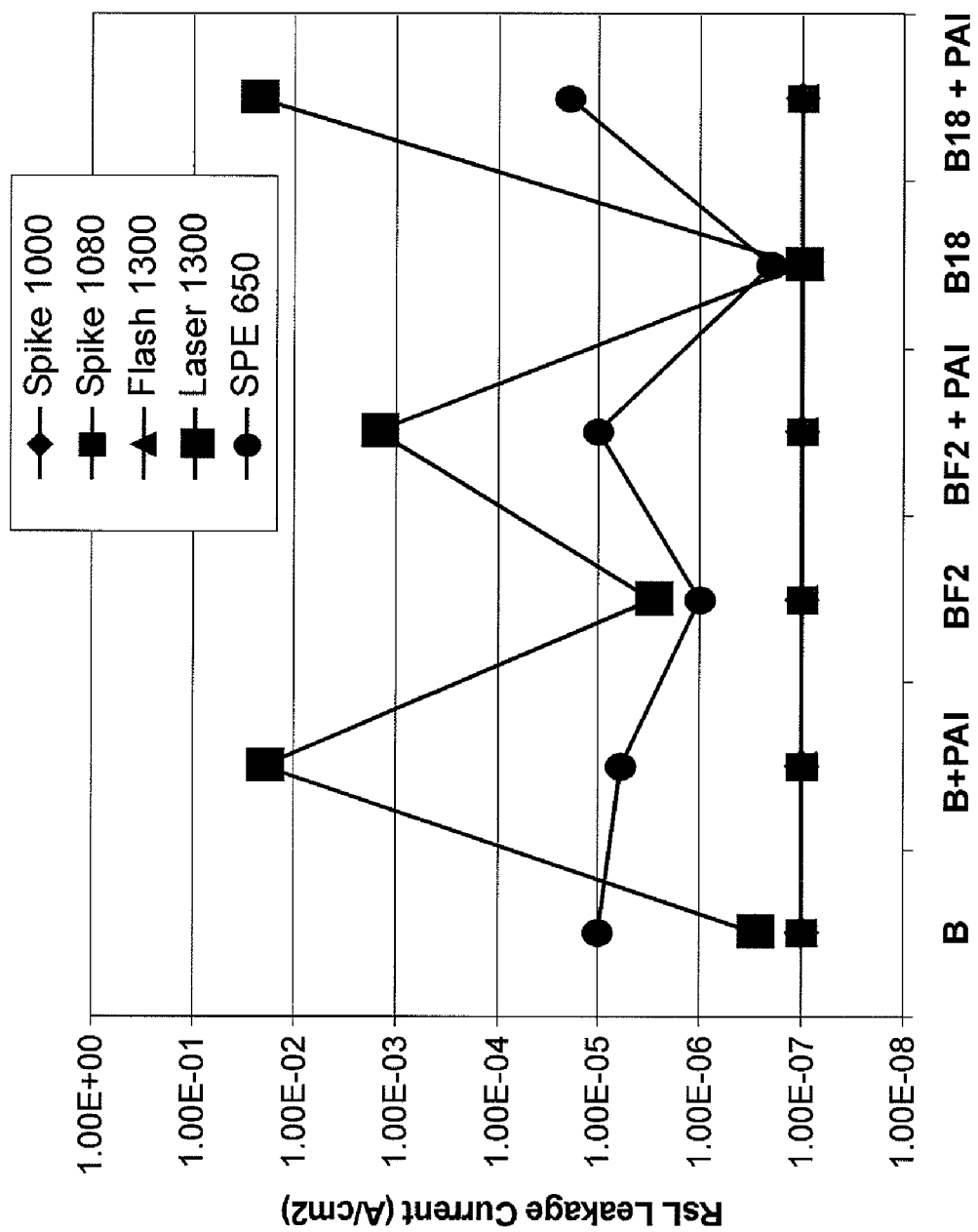
FIG. 18 is a graphical illustration illustrating junction leakage current by the Frontier method of JPV.

The relationship between damage profiles and junction leakage is illustrated by FIGS. 17 and 18 for a variety of implant and anneal conditions. Implants of $B^+$, $BF_2^+$, and $B_{18}H_x^+$ with and without Ge PAI and for spike, flash, laser, and SPE anneals, as illustrated in the legends, were performed. FIG. 17 shows photoluminescence data by the Accent PL method, as taught by John Borland et al., IEEE Proceedings of the XVIth International Conference on Ion Implantation Technology, Jun. 11-16, 2006, Marseilles, France pp. 96-100, hereby incorporated by reference, while in FIG. 8, junction leakage measured by the Frontier Semiconductor non-contact junction photo-voltage (JPV) method is shown. Only the $B_{18}H_x^+$ implants without Ge PAI show low damage and leakage for all anneal sequences. In particular, junction leakage after laser anneal is 2 decades lower using $B_{18}H_x^+$ than $B^+$ or $BF_2^+$. In addition, the use of a Ge PAI results in significantly higher leakage for all implant species.

Analysis of Self Amorphization Mechanism with Cluster Implantation

A pre-amorphization implant (PAI) step is typically used to avoid crystal channeling and thus achieving shallower junctions. Boron cluster ($B_{18}H_{22}$) enables very low energy boron implant processes for the formation of very shallow p-type junctions and effectively amorphizes the silicon eliminating the need for a PAI. The goal of this work is to provide an analysis of the self-amorphization mechanism and to compare a variety of cluster ion species with regard to their self-amorphization. SIMS profiles as a function of implant dose are presented. These data provide strong evidence for the elimination of channeling as the implant progresses and the silicon becomes amorphous. Additional confirmation is provided by the use of a subsequent channeling-sensitive 200 keV $P^+$ implant to show the threshold of channeling avoidance. XTEM is also used to show the physical structure of the material as a function of implant dose and correlate with the channeling behavior.

Introduction

The passage of an energetic ion through the Si lattice initiates a sequence of displacement events that leads to defect production. At sufficiently high doses, the crystalline silicon undergoes a crystalline-amorphous (c-a) transformation. In Si, amorphization occurs under ion irradiation when the free energy of the damaged crystalline phase is higher than that of the amorphous phase. Post-implant thermal processing is required to anneal out the damage and to electrically activate the introduced dopants. The formation of the amorphous phase also inhibits ion channeling and thus eliminates the channeling tail that one normally observes in a dopant profile. The process of amorphization depends on various factors like ion implant species, implant dose and substrate temperature. See for example, T. Mootoka, O. W. Holland, Appl. Phys. Lett. 61, 3005 (1992); T. Mootoka, O. W. Holland, Appl. Phys. Lett. 58, 2360 (1991); and T. Mootoka, F. Kobayashi, P. Fons, T. Tokuyama, T. Suzuki, N. Natsuaki, Jap. J. Appl. Phys. 30, 3617 (1991), hereby incorporated by reference.

There are differences in the degree of damage created by lighter ions and heavier ions or heavy cluster ion species. The amorphous layer created by heavy ion damage can be regrown easily in silicon resulting in relatively efficient dopant activation. In the case of lighter ions it is difficult to produce an amorphous layer below a certain dose, and the defects formed in such cases are comparatively stable; hence the dopant activation is affected. For example, B implanted into pre-amorphized Si can achieve high activation levels during regrowth at low annealing temperatures, for example, as taught by E. Landi, A. Armigliato, S. Solmi, R. Köghler, and E. Wieser, Appl. Phys. A A47, 359 (1988). The simultaneous observation of different characteristics during annealing for B in preamorphized Si and B in highly damaged crystalline Si can be clearly seen in K. S. Jones, R. G. Elliman, M. M. Petravic, and P. Kringhoj, Appl. Phys. Lett. 68, 3111 (1996), hereby incorporated by reference.

Moreover, when the substrate is amorphous, low temperature anneals such as SPE provides a good opportunity to repair the damage and activate the dopants efficiently. Interstitials and vacancies recombine and the excess interstitials form clusters of {311} defects near 800° C. Rodlike 311 defects are commonly observed in ion implanted silicon and are believed to play important roles in boron transient enhanced diffusion (TED) by providing interstitials during annealing processes. Below a certain damage threshold these {311} defects easily dissolve at a suitable anneal temperatures. Above a different damage threshold these defects can form dislocation loops that are difficult to remove. The use of pre-amorphization implants (PAI) produces a high activation level with a low thermal budget, and therefore, with minimal diffusion, for example, as disclosed by E. Landi, A. Armigliato, S. Solmi, R. Köghler, and E. Wieser, Appl. Phys. A A47, 359 (1988) and (7) S. Solmi, E. Landi, and F. Baruffaldi, J. Appl. Phys. 68, 3250 (1990). It has been reported by O. W. Holland, J. Narayan, D. Fathy, and S. R. Wilson, J. Appl. Phys. 59, 905 (1986), hereby incorporated by reference, that during the regrowth of an amorphous layer, B atoms are incorporated into substitutional positions and thus become electrically active that at least for concentrations lower than $10^{20}$ atoms/$cm^3$. At the same time, the excess or deficiency of atoms existing in the amorphous layer that extends to the surface are swept towards the surface where they are annihilated. Only damage beyond the amorphous/crystalline interface remains after regrowth, which evolve into Si-interstitial clusters, {311}—a designation of orientation relative to the crystallographic layout of the lattice. defects, and dislocation loops. Therefore, it can be assumed for simplicity that just after the regrowth, all B atoms within the amorphous region are in substitutional positions, and defects are removed from that region, while in the crystalline region B atoms interact with Si interstitials generated by the PAI.

Recently, it has been reported by D. R. Tieger, W. Divergilio, E. C. Eisner, M. Harris, T. J. Hsieh, J. Miranda, W. P. Reynolds, T, Horsky, IIT, (2006), hereby incorporated by reference, that the use of molecular or "cluster" implantation has enabled dopant-bearing molecules (such as $B_{18}H_{22}$) and carbon-bearing molecules ($C_{16}H_x$, $C_{14}H_x$) to increase throughput and decrease implantation depth for certain USJ PMOS applications. The present invention is a significant improvement relative to current technology and consists of creating an amorphous layer through carbon cluster implantation at a depth which encompasses the EOR of a subsequent dopant implant. In accordance with the present invention, the subsequent dopant implant can be a cluster but can also be a monomer implant, BF2, As2, etc. In accordance with an important aspect of the invention, dopant implants, which normally cause damage to the substrate crystalline structure, i.e. dopants other than cluster ion dopants, such as monomer and molecular dopants are completely contained within the amorphous region created by the carbon cluster co-implant. As such, no extended defects can exist. Any defects caused by the dopant implant are annealed out, for example with msec anneals.

The important parameter that is crucial in obtaining the such shallow junction is the self-amorphizing nature of both boron cluster and carbon cluster implants. Similar to carbon cluster and boron cluster combination implants, in accordance with the present invention, a carbon cluster with an arsenic cluster, such as $As_4$, or a carbon cluster and a phosphorous cluster, such as $P_4$, produce similar effects on the diffusion of n-type dopants. Since boron and carbon cluster implantation are becoming mainstream manufacturing processes, it is therefore important to characterize the self-amorphization effects of $B_{18}H_{22}$ and $C_{16}H_{10}$ and look at the possibility to eliminate standard PAI implants to avoid channeling effect and EOR damage resulting in low damage high quality junctions The present invention illustrates that the amorphizing properties of various cluster species and to evaluate the amorphous layer depth using XTEM measurements. We used a channeling sensitive implant ($P^+$, 200 keV, 1e14 atoms/$cm^2$) to probe the degree of damage by $B_{18}H_{22}$ implants (500 eV and 5 keV per boron atom) at various doses and correlate the results with XTEM measurements. This study will shed some light on the role played by amorphization in dopant activation for both USJ and stress engineering applications.

EXPERIMENTAL

Wafers used in this study were 200 mm, n-type, (100) silicon substrates. The wafers were implanted with various cluster species at different energies and doses using $B_{18}H_x^+$, $C_{16}H_x^+$, $C_7H_x^+$ ions from a ClusterIon® source. TW measurements were performed on the as-implanted wafers before performing SIMS and XTEM measurements. The samples were imaged on a JEOL 2010 FEG TEM using on-axis multi beam imaging conditions.

Results and Analysis

Boron Cluster

Figure 19B:
FIG. 19B is similar to FIG. 19A except the boron implant is 1e14 atoms/cm$^2$ (3 nm deep amorphous pockets).
Figure 19C:
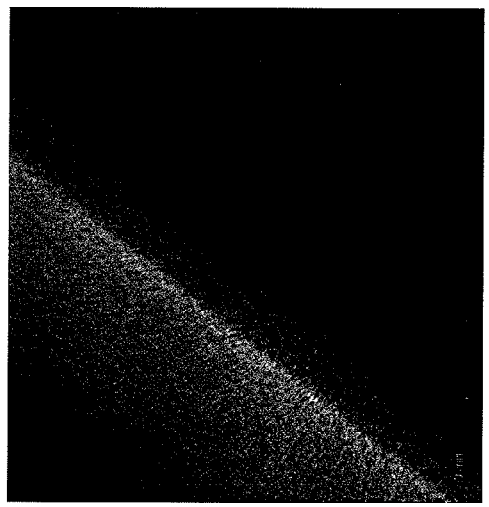
FIG. 19C is similar to FIG. 19A except the boron implant is 1e15 atoms/cm$^2$ (6.2 nm thick amorphous layer). The arrow indicates the position of the surface.
Figure 19A:
FIG. 19A shows a 500 eV per boron atom implant at 5e13 atoms/cm$^2$ (no amorphous layer)

FIGS. 19 A, B and C shows XTEM images of $B_{18}H_{22}$ 500 eV per boron atom implant at doses 5e13, 1e14 and 1e15 atoms/$cm^2$ respectively. For 5e13 dose XTEM image (FIG. 19A), there is no evidence for the presence of amorphous layer. For the 1e14 dose, one can see clearly amorphous pockets that are 3 nm deep. At 1e15 dose there is a clear presence of an amorphous layer roughly about 6.2 nm thick. This amorphous layer depth is roughly the sum ($R_p+\Delta R_p$) of projected range ($R_p$) and the straggle ($\Delta R_p$) for boron at 500 eV. FIG. 19 shows a 500 eV per boron atom implant at A 5e13 atoms/$cm^2$ (no amorphous layer) B 1e14 atoms/$cm^2$ (3 nm deep amorphous pockets) C 1e15 atoms/$cm^2$ (6.2 nm thick amorphous layer). The arrow indicates the position of the surface.

To evaluate the threshold dose for amorphization, $B_{18}H_{22}$ was implanted at 0.5 keV and 5 keV (per boron atom) at various doses from 1e13 to 1e15 atoms/$cm^2$, and a channeling sensitive P+, 200 keV, 1e14 implant was performed at 0° tilt and 0° twist on those wafers to determine the degree of damage created by the boron cluster implants. It is expected that P will penetrate deeper in crystalline Si and shallower in amorphous Si. SIMS measurements were carried out to determine P profile and from the profile determined the critical dose for amorphization threshold. FIGS. 2A and 2B shows the P SIMS profile on the samples implanted with 0.5 keV and 5.0 keV per boron atom boron cluster at various doses.

Figure 20B:
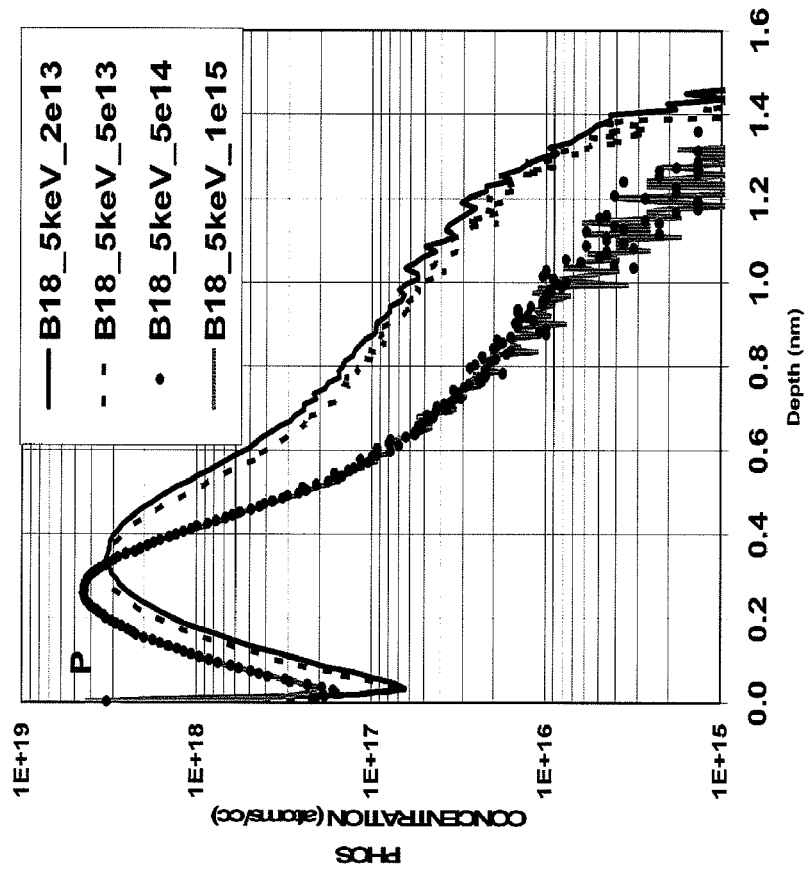
FIG. 20B is similar to FIG. 20A except at 1e14
Figure 20A:
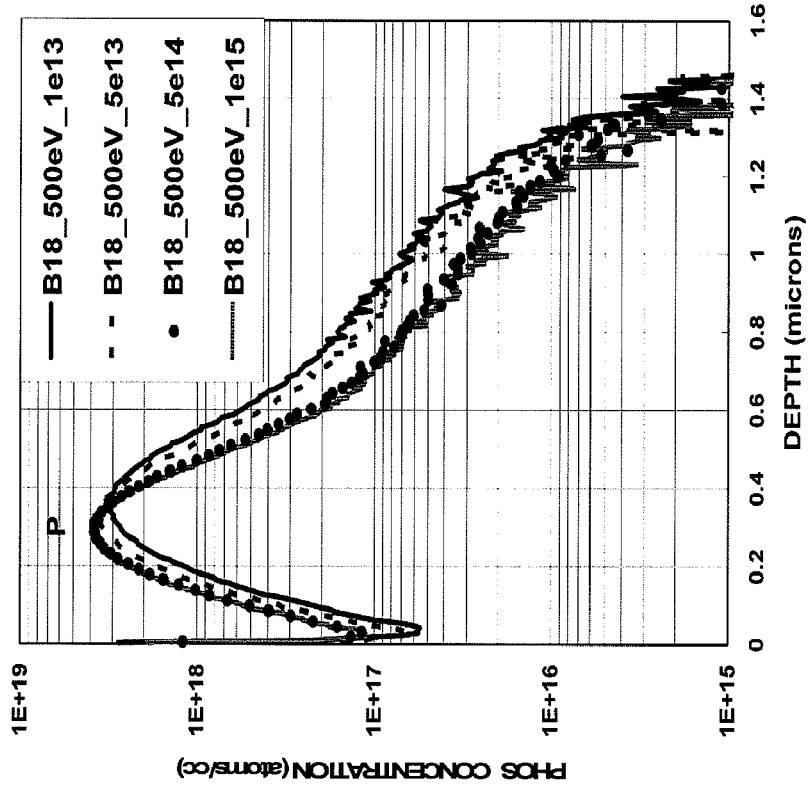
FIG. 20A is a SIMS profile for P+, 200 keV at 0° tilt and 0° twist.

FIG. 20 is a SIMS profile for P+, 200 keV, 1e14 at 0° tilt and 0° twist. From FIG. 20A it is seen that the P profile is different for boron cluster implant with 1e13 and 1e15 dose. The depth at P concentration of 1e17 atoms/$cm^3$ for 1e13 dose is around 0.9 μm and for 1e15 it is 0.7 μm. The deeper profile for 1e13 is likely due to the steering of P atoms in crystalline Si. Since such a low implant dose does not produce any appreciable damage, the P implant undergoes channeling and travels deeper into the crystal. At a1e15 dose it is shown that boron cluster creates an amorphous layer depth of 6.2 nm (FIG. 19C). The presence of an amorphous layer on the top of the crystalline Si dechannels the impinging P atoms and thus steers them away from the channel. These steered away atoms undergo multiple random collisions with Si atoms and lose energy before coming to rest at a relatively shallower depth when compared to a case with a crystalline one. At a dose of 5e13, the depth of P profile at 1e17 atoms/$cm^3$ is already close to 0.8 μm. This is roughly half the decrease in depth when compared to a completely amorphous case. Even at a boron cluster dose of 5e13, there is an appreciable degree of crystalline damage in Si. If one looks at the XTEM image at 5e13 dose in FIG. 19A, there is no clear evidence for the presence of any amorphous layer. At a dose of 1e14 (FIG. 1B), XTEM shows a discontinuous 3 nm deep layer of amorphous pockets. XTEM is not sensitive enough to pick up partially amorphized Si or deficiently recrystallized phase. Yoshimoto et al (12) have reported XTEM and Raman measurements on flash annealed boron samples where they claim that XTEM could not pick up deficiently recrystallized phase, whereas Raman measurements clearly showed deficiently recrystallized phase. These results indicate that to avoid channeling effect at this energy range, we do not need a higher dose of boron cluster than 5e14 atoms/cm$^2$.

Figure 21:
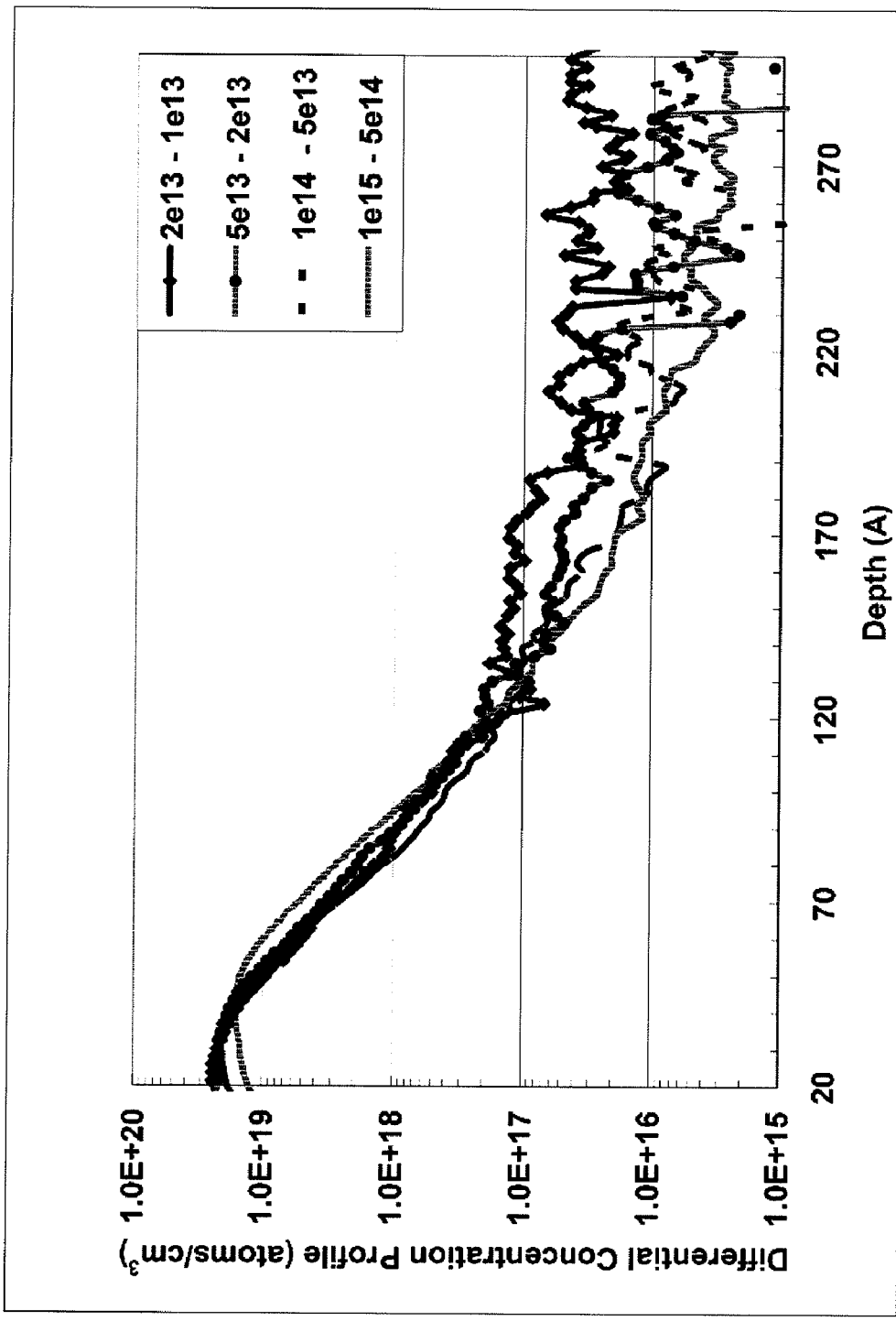
FIG. 21 is a differential boron SIMS profile for $B_{18}H_{22}$ at 0.5 keV implanted at various doses.

FIG. 21 is a differential boron SIMS profile for $B_{18}H_{22}$ at 0.5 keV implanted at various doses. In particular, FIG. 21 shows the boron differential profile for 0.5 keV per boron atom boron cluster implants. All the boron profiles were smoothed by doing a 5 point averaging and normalized with respect to 1e13 profile. The differential SIMS profile was made by subtracting profiles. For example, the profile entitled "2e13-1e13" is obtained by subtracting the SIMS profile from a 1e13 dose from the profile from a 2e13 dose. FIG. 21 shows the incremental boron concentration for various doses. It is clear that we can observe the channeling tail up to 5e13 dose. Beyond 5e13 there is practically no difference in the boron profile below a concentration of 1e17 atoms/cm$^3$. This indicates that threshold dose for amorphization at 0.5 keV boron cluster implant is around 5e13 atoms/cm$^2$. FIG. 22 shows the P profile for the 5 keV boron cluster implant. While the he threshold for amorphization is still around 5e13 atoms/cm$^2$ it is not as clearly evident as in the case of 0.5 keV per boron atom implants.

Carbon Cluster

The Carbon cluster chemical $C_{16}H_{10}$ is a solid at room temperature and vaporizes in the same temperature range as a boron cluster. The soft ionization system developed for boron cluster also works very well for the carbon cluster vapor, which produces slightly higher electrical beam currents due to the narrower AMU spectrum of a carbon cluster. In addition, the carbon cluster ion is in the same AMU range as a boron cluster (~200 AMU) and so the remainder of the implant system works the same as with boron cluster. It is shown that carbon cluster inhibits boron diffusion during the anneal process, consistent with other developments using monomer carbon. Further, the combination of carbon cluster, boron cluster and conventional spike annealing technologies are shown to produce ultra-shallow junctions appropriate for the 45 nm SDE. We have also another carbon cluster material $(C_{14}H_x)$ that can provide $C_7H_y$ molecule. With a lower AMU the carbon equivalent energy can be pushed higher to enable deeper Carbon cluster implants. Based on these results it becomes necessary to characterize the self-amorphizing properties of these Carbon cluster species. Here we report XTEM results for the amorphous layer depth created by these species at few implant energies and doses.

Figure 22B:
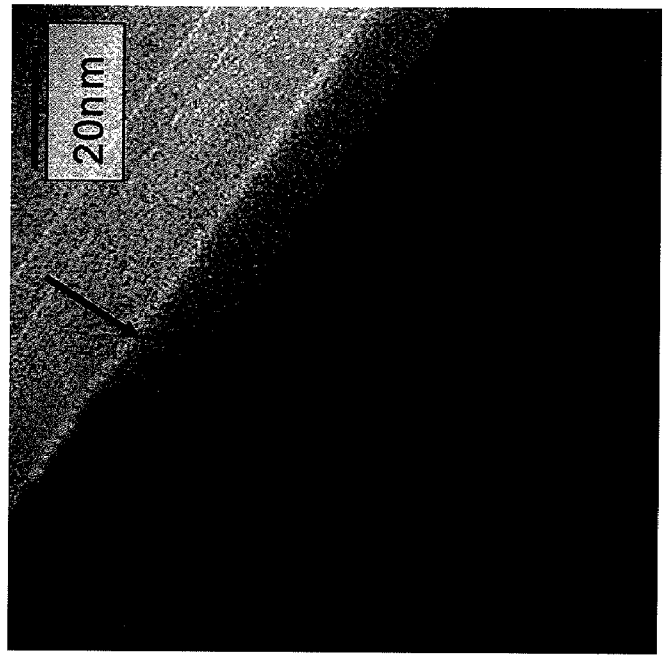
FIG. 22B is similar except at 2 keV per carbon atom
Figure 22A:
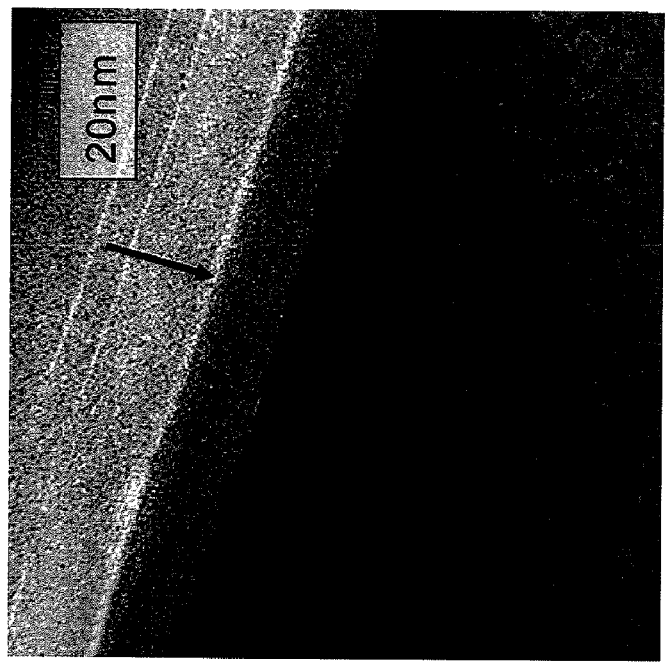
FIG. 22A shows XTEM images of $C_{16}H_x$ implant at 1e15 atoms/cm$^2$ at 3 keV per carbon atom. The amorphous layer depth at 3 & 2 keV are 14 nm and 12 nm, respectively. The arrow indicates the surface position.

It has been shown that 2-3 keV per carbon atom with a dose around 1e15 atoms/cm$^2$ is appropriate to use as a diffusion controlling implant with low energy (0.5 keV) boron implants. So it is relevant to show the results of the amorphous layer depth created by Carbon cluster species at those energies and dose. FIG. 22 shows XTEM images of $C_{16}H_x$ implant at 1e15 atoms/cm$^2$ at (A) 3 keV per carbon atom & (B) 2 keV per carbon atom. The amorphous layer depth at 3 & 2 keV are 14 nm and 12 nm, respectively. The arrow indicates the surface position. In particular, FIGS. 22A and 22B show XTEM images of 3 keV & 2 keV per carbon atom $C_{16}H_x$ implants at a dose of 1e15 atoms/cm$^2$. The amorphous layer depths at 3 keV & 2 keV are around 14 nm & 12 nm respectively at a dose of 1e15 atoms/cm$^2$. The amorphous layer depth created are well above the Rp of 0.5 keV boron equivalent implant energies (Rp=3.4 nm, ΔRp=2.9 nm) and the whole boron profile is well within the amorphous layer created by the Carbon cluster implants.

Figure 23B:
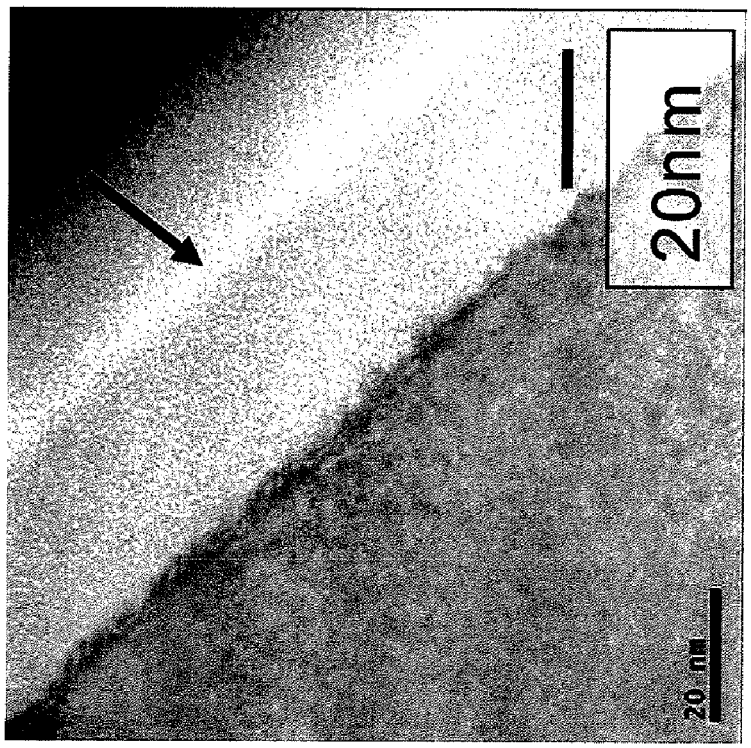
FIG. 23B is similar to FIG. 23A except at 2e15 atoms/cm$^2$.
Figure 23A:
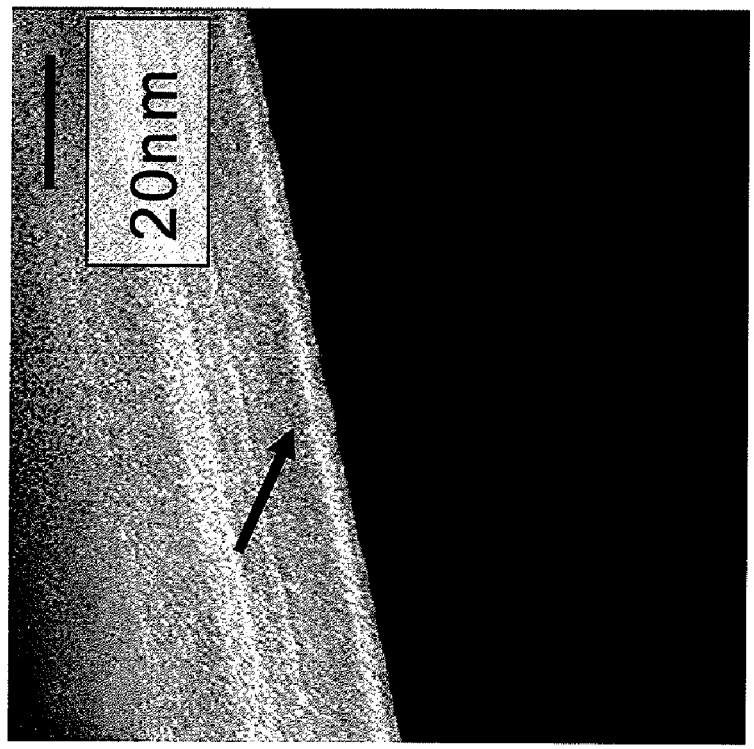
FIG. 23A illustrates XTEM images of $C_7H_x$ implant at 10 keV per carbon atom at 3e14 atoms/cm$^2$. The arrow indicates the surface position.

Carbon cluster implant with $C_7H_x$ species at 10 keV per carbon atom showed no amorphous layer at 3e14 dose. FIG. 5 shows XTEM images of $C_7H_x$ implant at 10 keV per carbon atom at A 3e14 atoms/cm$^2$ & B 2e15 atoms/cm$^2$. The arrow indicates the surface position. In particular, FIG. 23A shows XTEM image at 3e14 dose. Similar to $B_{18}H_{22}$ implant where the channeling sensitive P+, 200 keV implant showed some degree of crystal damage even around 5e13 dose, we believe that for Carbon cluster implant at 3e14 dose, there is some degree of crystal damage that is not detected by XTEM. At 2e15 dose FIG. 23B we see a very clean amorphous layer (~26 nm). This amorphous layer depth is very crucial in activating the dopants i.e. placing the carbon atoms in substitutional site. Such activation is the key factor in producing stress in Si lattice.

Figure 24:
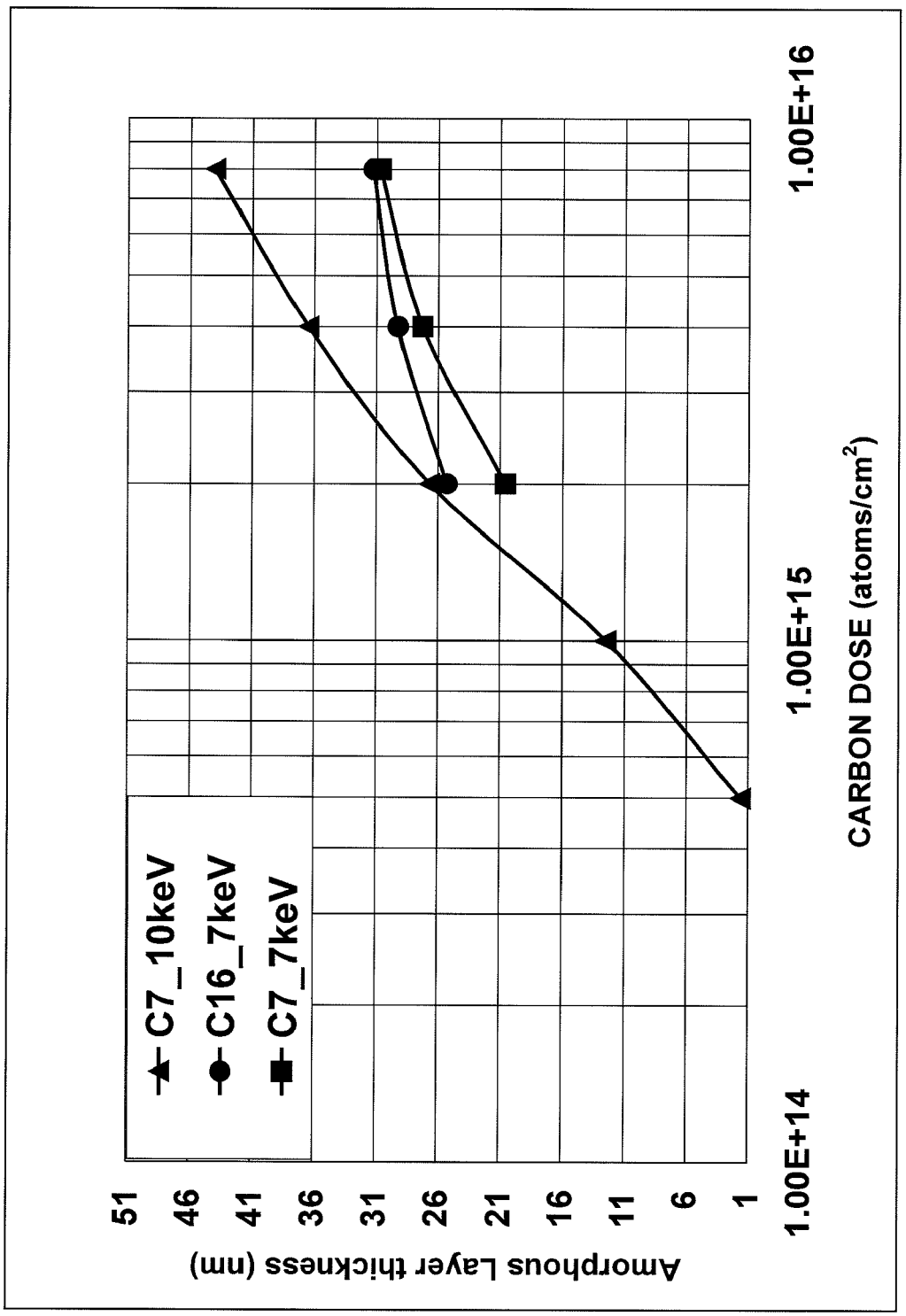
FIG. 24 shows amorphous layer thickness at various doses for few energies of $C_{16}H_x$ and $C_7H_x$ species.

FIG. 24 shows amorphous layer depth vs carbon dose (from XTEM) for various energies and doses for $C_7H_x$ and $C_{16}H_x$. In particular, FIG. 6 shows amorphous layer thickness at various doses for few energies of $C_{16}H_x$ and $C_7H_x$ species.

Comparing the amorphous layer depth produced by $C_{16}H_x$ and $C_7H_x$ species at same equivalent carbon energies, it is clear that $C_{16}H_x$ produces a larger amorphous depth when compared to $C_7H_x$. This difference is basically coming from the heavier mass of the Carbon cluster. Comparing $C_7H_x$ at same dose but at different energies, we see a greater amorphous layer depth for higher energy. This follows from the deeper projected range and higher lateral straggle.

CONCLUSIONS

Boron cluster and carbon cluster species show self-amorphizing properties that eliminate the need for a PAI implant. Using the channeling-sensitive 200 keV P$^+$ implant it is found that even at a boron dose of 5e13 atoms/cm$^2$, there is sufficient crystal damage to reduce channeling effects. At a dose of 5e14 atoms/cm$^2$, the degree of damage is enough to avoid channeling. The amorphous layer depth produced by $C_{16}H_x$ is greater than the depth produced by $C_7H_x$ species owing to the heavier mass for the former. The amorphous layer depth determined for various energies and doses for Carbon cluster ions ($C_{16}H_x^+$, $C_7H_x^+$) will prove useful for applications that require amorphization and activation.

The creation of low-leakage junctions is enabling for the next generations of mobile devices. A significant contributor to junction leakage is the creation and retention of EOR defects. The Ge PAI produces EOR defects which cannot be annealed out by low-thermal budget anneals, as illustrated by FIG. 5 and also previous work [5]. FIGS. 3 and 4 illustrate that by substituting $B_{18}H_x^+$ for either $BF_2^+$ or $B^+$ in fabricating SDE for PMOS, EOR defects can be eliminated. In addition, FIG. 1A demonstrates that the very implantation of $B_{18}H_x^+$ at doses appropriate for creating SDE creates an amorphous layer which nearly eliminates channeling, as has been previously reported [7].

Why does $B_{18}H_x^+$ implantation produce defect-free junctions? While there is no consensus on the mechanism for this effect, it is reasonable to assume it is a consequence of the amorphization characteristics of the cluster implant [2]. When a molecular cluster is implanted, it breaks the molecular bonds at the surface, releasing individual atoms which have the same implantation profiles as atomic species implanted at the same velocity, as characterized by their range $R_p$ and straggle $\Delta R_p$. For clusters consisting of at least ten like atoms, for example, the damage cascades of adjacent atoms tend to overlap critically, releasing a high energy density in the local volume of silicon. This release of energy can induce local melting of silicon which follows the cascades into the silicon, resulting in amorphous silicon without EOR defects, or at least defects which are easily annealed out by the subsequent activation step.

The use of a carbon co-implant has demonstrated a significant benefit in limiting boron transient-enhanced diffusion and to produce shallower, more abrupt junctions. Unfortunately, the implantation of C can also introduce EOR defects, thus trading off reduced junction depth for increased leakage. As demonstrated by FIG. 6, the combination of a carbon cluster implant with a boron cluster implant yields defect-free junctions. The efficacy of this approach extends from the same mechanism just described for $B_{18}H_x^+$ implantation. For example, FIG. 11B shows a 1e15, 3 keV per carbon $C_{16}H_x^+$ implant which produced a 14 nm amorphous layer. Thus, the implantation of $C_{16}H_x^+$ can be used as an amorphizing implant. If, after the $C_{16}H_x^+$ implant is conducted, a conductive dopant implant (for example, As, P, Sb, In, B, or $BF_2$, or the clusters $As_2$, $As_4$, $P_2$, $P_4$, $C_2B_{10}H_{12}$, $B_{10}H_{14}$, $B_{18}H_{22}$, or any dopant-bearing molecule) is performed at an energy such that its end of range (EOR) falls within the amorphous layer, the EOR defects from that dopant implant will not survive the subsequent activation process. The set of implant conditions used in FIG. 16 represents such a process sequence, for the carbon cluster implant produced a 14 nm thick amorphous layer, and the 500 eV $B_{18}H_x^+$ EOR (calculated by $R_p+2\Delta R_p$) is about 9 nm deep, easily within the amorphous layer produced by the $C_{16}H_x^+$ implant. As also shown in FIG. 12, this set of implant conditions is effective for diffusion control. Thus, it can be used in lieu of a monomer C implant whenever boron diffusion control is desired.

Thus, the preferred embodiment of the process sequence we are recommending is as follows:

a) implant carbon cluster at a great enough dose and energy to produce an amorphous layer deep enough to include the EOR of a subsequent n- or p-type dopant implant;

b) perform said dopant implant, preferably to produce a shallow junction, such as an NMOS or PMOS source/drain extension;

c) activate the dopants with a low thermal budget anneal, such as flash, laser or SPE anneal, or with a spike anneal.

It has been established that the role of carbon in the control of boron diffusion is the gettering of interstitial defects. During TED, boron pairs with interstitials and this mechanism is responsible for rapid boron movement through the crystal lattice. It may be that these gettering effects, in addition to the benefits of amorphization just described, further contributes to the observed lack of EOR defects after anneal.

The relationship between damage profiles and junction leakage is illustrated by FIGS. 17 and 18 for a variety of implant and anneal conditions. Implants of $B^+$, $BF_2^+$, and $B_{18}H_x^+$ with and without Ge PAI and for spike, flash, laser, and SPE anneals, as illustrated in the legends, were performed. FIG. 17 shows photoluminescence data by the Accent PL method, as discussed above, while in FIG. 18, junction leakage measured by the Frontier Semiconductor non-contact junction photo-voltage (JPV) method is shown. Only the $B_{18}H_x^+$ implants without Ge PAI show low damage and leakage for all anneal sequences. In particular, junction leakage after laser anneal is 2 decades lower using $B_{18}H_x^+$ than $B^+$ or $BF_2^+$. In addition, the use of a Ge PAI results in significantly higher leakage for all implant species.

Obviously, many modifications and variations of the present invention are possible in light of the above teachings. Thus, it is to be understood that, within the scope of the appended claims, the invention may be practiced otherwise than as specifically described above.

What is claimed and desired to be secured by a Letters Patent of the United States is:

1. A method of implantation for semiconductor manufacturing, comprising the following steps:
   a. creating a flow of $C_nH_m$ vapor or gas, where n and m are integers such that n>1 and m≧0;
   b. introducing said vapor or gas into the ion source of an ion implanter;
   c. ionizing said vapor or gas to form ions of $C_nH_x^+$, where x is a positive integer or zero;
   d. accelerating said ions into a n- or p-type silicon substrate at a depth $R_p$;
   e. implanting a dopant ion of the form $A_nR_zH_x^+$ to a silicon depth $R'_p<R_p$, defining a doped silicon substrate, where A is either an n- or p-type dopant in silicon, selected from the group of As, P, B, In or Sb, and where R denotes a molecule whose atomic constituents are not injurious to the silicon transistor formation process, selected from the group of Si, Ge, F, or C, and n, x and z are positive integers greater than or equal to zero;
   f. activating said doped silicon substrate with a heat treatment to cure defects resulting from said implanting of said dopant ion.

2. The method of claim 1, where $C_nH_x^+$ is $C_{16}H_x^+$ or $C_7H_x^+$.
3. The method of claim 1 where $A_nR_zH_x^+$ is $B_{18}H_x^+$.
4. The method of claim 1 where $A_nR_zH_x^+$ is a carborane.
5. The method of claim 4 where $A_nR_zH_x^+$ is $C_2B_{10}H_x^+$.
6. The method of claim 1 where $A_nR_zH_x^+$ is $BF_2^+$.
7. The method of claim 1 where $A_nR_zH_x^+$ is B.
8. The method of claim 1 where $A_nR_zH_x^+$ is $B_{10}H_x^+$.
9. The method of claim 1 where $A_nR_zH_x^+$ is $B_{20}H_x^+$.
10. The method of claim 1 where $A_nR_zH_x^+$ is $B_2H_x^+$.
11. The method of claim 1 where $A_nR_zH_x^+$ is $B_5H_x^+$.
12. The method of claim 1 where $A_nR_zH_x^+$ is $P_7H_x^+$.
13. The method of claim 1 where $A_nR_zH_x^+$ is $As_7H_x^+$.
14. The method of claim 1 where $A_nR_zH_x^+$ is $(CH_3)_5P_7^+$.
15. The method of claim 1 where $A_nR_zH_x^+$ is $P_7(SiMe_3)_3^+$.
16. The method of claim 1 where $A_nR_zH_x^+$ is $As_7(SiH_3)_3^+$.

17. A method of implantation for semiconductor manufacturing, comprising the following steps:
   a. creating a flow of $A_nR_zH_x$ vapor or gas, defining a dopant vapor or gas, where A is either an n- or p-type dopant in silicon, selected from the group of As, P, B, In or Sb, and R denoting a molecule whose atomic constituents are not injurious to the silicon transistor formation process, selected from the group of Si, Ge, or C, and n, x and z are positive integers greater than or equal to zero;
   b. introducing said dopant vapor or gas into the ion source of an ion implanter;
   c. ionizing said vapor or gas to form dopant-containing ions of $A_bL_zH_x^+$ where b is a positive integer ≦n, x is a positive integer or zero, and $L_z$ contains one or more of the constituents of $R_z$, where z is a positive integer greater than or equal to zero;
   d. accelerating said dopant-containing ions into a n- or p-type silicon substrate at a depth $R_p'$;
   e. creating a flow of $C_kH_f$ vapor or gas, defining a carbon-based vapor or gas, where k and f are integers such that k>1 and f≧0;
   f. introducing said carbon based vapor or gas into the ion source of an ion implanter;
   g. ionizing said carbon based vapor or gas to form carbon containing ions of $C_kH_x^+$, where x is a positive integer or zero;
   h. accelerating said carbon containing ions onto the said silicon substrate to a depth $R_p>R_p'$;
   i. activating the dopant(s) with a heat treatment to cure defects resulting from said implanting of said dopant-containing ions.

* * * * *